United States Patent
Kim

(10) Patent No.: US 9,287,528 B2
(45) Date of Patent: Mar. 15, 2016

(54) ORGANIC LIGHT EMITTING DIODE DISPLAY HAVING HIGH RESOLUTION AND METHOD OF MANUFACTURING THE SAME

(71) Applicant: Samsung Display Co., Ltd., Yongin, Gyeonggi-Do (KR)

(72) Inventor: Deok-Hoi Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 97 days.

(21) Appl. No.: 14/063,745

(22) Filed: Oct. 25, 2013

(65) Prior Publication Data

US 2014/0117340 A1 May 1, 2014

(30) Foreign Application Priority Data

Oct. 26, 2012 (KR) ........................ 10-2012-0119730

(51) Int. Cl.
| | |
|---|---|
| *H01L 27/32* | (2006.01) |
| *H01L 29/786* | (2006.01) |
| *H01L 51/50* | (2006.01) |
| *H01L 51/56* | (2006.01) |
| *H01L 21/8234* | (2006.01) |
| *H01L 27/12* | (2006.01) |
| *H01L 29/66* | (2006.01) |

(52) U.S. Cl.
CPC ........ *H01L 51/56* (2013.01); *H01L 21/823418* (2013.01); *H01L 27/127* (2013.01); *H01L 27/1255* (2013.01); *H01L 27/3262* (2013.01); *H01L 29/66757* (2013.01); *H01L 29/78621* (2013.01); *H01L 29/78696* (2013.01)

(58) Field of Classification Search
CPC ........................ H01L 27/127; H01L 2021/775
See application file for complete search history.

(56) References Cited

U.S. PATENT DOCUMENTS

| 6,646,287 B1 * | 11/2003 | Ono et al. ........................ 257/66 |
| 6,914,642 B2 | 7/2005 | Yamazaki et al. |
| 2002/0000551 A1 * | 1/2002 | Yamazaki et al. ............... 257/59 |
| 2002/0028544 A1 * | 3/2002 | Fujimoto et al. .............. 438/166 |
| 2005/0138507 A1 * | 6/2005 | Kurokawa ..................... 714/724 |

FOREIGN PATENT DOCUMENTS

| KR | 100297868 B2 | 9/1996 |
| KR | 1020040038729 A | 5/2004 |
| KR | 1020060058920 A | 6/2006 |

* cited by examiner

*Primary Examiner* — Stephen W Smoot
(74) *Attorney, Agent, or Firm* — Robert E. Bushnell, Esq.

(57) ABSTRACT

An organic light emitting diode display device includes a substrate including a pixel portion and a peripheral portion, a semiconductor layer including a pixel switching semiconductor layer and a driving semiconductor layer formed on the pixel portion, and a peripheral switching semiconductor layer formed on the peripheral portion. A first gate insulating layer is formed on the semiconductor layer. A peripheral switching gate electrode is formed on the first gate insulating layer of the peripheral portion, and a pixel switching gate electrode and a driving gate electrode are formed on the first gate insulating layer of the pixel portion. A length of a peripheral switching low concentration doping region formed in the peripheral switching semiconductor layer may be larger than a length of a pixel switching low concentration doping region and a driving low concentration doping region formed in the pixel switching semiconductor layer and the driving semiconductor layer, respectively.

24 Claims, 16 Drawing Sheets

ORGANIC LIGHT EMITTING DIODE DISPLAY HAVING HIGH RESOLUTION AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 26 Oct. 2012 and there duly assigned Ser. No. 10-2012-0119730.

BACKGROUND OF THE INVENTION

1. Field of the Invention

The described technology relates generally to an organic light emitting diode display device and a method of manufacturing the same, and particularly, to an organic light emitting diode display device having improved grayscale control and a method of manufacturing the same.

2. Description of the Related Art

An organic light emitting diode display includes two electrodes and an organic emission layer interposed therebetween, electrons injected from one electrode and holes injected from the other electrode are bonded to each other in the organic emission layer to form an exciton, and light is emitted while the exciton discharges energy.

The organic light emitting diode display device includes a pixel portion including a plurality of pixels on which an organic light emitting diode that is a self-light emitting diode is formed, and a peripheral portion surrounding the pixel portion. A plurality of transistors and capacitors for driving the organic light emitting diode are formed on each pixel of the pixel portion, and a plurality of transistors and capacitors forming a driver are formed on the peripheral portion. A plurality of transistors of the pixel portion basically includes a switching transistor and a driving transistor, and a plurality of transistors of the peripheral portion basically includes the switching transistor.

The higher a resolution of the organic light emitting diode display device is, the lower a quantity of the current per the pixel is, and thus, a driving range of a gate voltage applied to a gate electrode of the switching transistor and the driving transistor of the pixel portion becomes narrow to easily generate stains and reduce a charging ability of the switching transistor of the peripheral portion.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode display device broadening a driving range of a driving transistor of a pixel portion to display a lot of grayscales and improving charge mobility of a peripheral switching transistor of a peripheral portion.

An embodiment provides an organic light emitting diode display device including a substrate including a pixel portion displaying an image and a peripheral portion surrounding the pixel portion, a semiconductor layer including a pixel switching semiconductor layer and a driving semiconductor layer formed on the pixel portion, and a peripheral switching semiconductor layer formed on the peripheral portion, a first gate insulating layer formed on the semiconductor layer, a peripheral switching gate electrode formed on the first gate insulating layer of the peripheral portion, a pixel switching gate electrode and a driving gate electrode formed on the first gate insulating layer of the pixel portion, and a second gate insulating layer covering the peripheral switching gate electrode, the pixel switching gate electrode, and the driving gate electrode. A length of a peripheral switching low concentration doping region formed in the peripheral switching semiconductor layer may be larger than a length of a pixel switching low concentration doping region and a driving low concentration doping region formed in the pixel switching semiconductor layer and the driving semiconductor layer, respectively.

A doping degree of the peripheral switching low concentration doping region formed in the peripheral switching semiconductor layer may be larger than a doping degree of the pixel switching low concentration doping region and the driving low concentration doping region formed in the pixel switching semiconductor layer and the driving semiconductor layer, respectively.

The length of the pixel switching low concentration doping region formed in the pixel switching semiconductor layer may be larger than the length of the driving low concentration doping region formed in the driving semiconductor layer.

The doping degree of the pixel switching low concentration doping region formed in the pixel switching semiconductor layer may be larger than the doping degree of the driving low concentration doping region formed in the driving semiconductor layer.

The organic light emitting diode display device may further include a storage capacitor overlapping the driving semiconductor layer.

The storage capacitor may include a first storage capacitive plate formed on the first gate insulating layer and overlapping the driving semiconductor layer, and a second storage capacitive plate formed on the second gate insulating layer covering the first storage capacitive plate and overlapping the first storage capacitive plate.

The driving semiconductor layer may include a plurality of bent portions.

The driving semiconductor layer may include a plurality of first extension portions extending in a first direction and a plurality of second extension portions extending in a second direction that is different from the first direction The bent portions connect the first extension portions and the second extension portions.

The organic light emitting diode display device may further include a scan line formed on the substrate and transferring a scan signal, a data line and a driving voltage line crossing the scan line and transferring a data signal and a driving voltage, respectively, a pixel switching transistor connected to the scan line and the data line and including the pixel switching semiconductor layer and the pixel switching gate electrode, a driving transistor connected to a pixel switching drain electrode of the pixel switching transistor and including the driving semiconductor layer and the driving gate electrode, and an organic light emitting diode connected to a driving drain electrode of the driving transistor.

The organic light emitting diode display device may further include a peripheral switching transistor including the peripheral switching semiconductor layer and the peripheral switching gate electrode.

The organic light emitting diode display device may further include a compensation transistor compensating a threshold voltage of the driving transistor and connected to the driving transistor.

The organic light emitting diode display device may further include a light emission control transistor turned-on by a light emission control signal transferred by a light emission control line to transfer the driving voltage from the driving transistor to the organic light emitting diode. The light emission control transistor may be positioned between the driving drain electrode of the driving transistor and the organic light emitting diode.

The organic light emitting diode display device may further include an interlayer insulating layer covering the second storage capacitive plate, a connection member formed on the interlayer insulating layer and connected through a contact hole formed in the second gate insulating layer and the interlayer insulating layer to the first storage capacitive plate, and a protective layer covering the interlayer insulating layer and the connection member. The connection member may be connected to a compensation drain electrode of the compensation transistor.

The scan line may be formed on the same layer as the first storage capacitive plate, and the data line and the driving voltage line may be formed on the same layer as the connection member.

The driving voltage line may be connected through a contact hole formed in the interlayer insulating layer to the second storage capacitive plate.

The organic light emitting diode display may further include an operation control transistor turned-on by the light emission control signal transferred by the light emission control line to transfer the driving voltage to the driving transistor. The operation control transistor may be positioned between the driving voltage line and a driving source electrode of the driving transistor.

The organic light emitting diode display device may further include an initialization transistor turned-on according to a prior scan signal transferred through a prior scan line to transfer an initialization voltage to the driving gate electrode of the driving transistor. The initialization transistor may be positioned between the initialization voltage line and the driving gate electrode of the driving transistor.

Another embodiment provides a method of manufacturing an organic light emitting diode display device including preparing a substrate including a pixel portion and a peripheral portion, forming a pixel switching semiconductor layer and a driving semiconductor layer on the pixel portion and a peripheral switching semiconductor layer on the peripheral portion, forming a first gate insulating layer on the pixel switching semiconductor layer, the driving semiconductor layer, and the peripheral switching semiconductor layer, forming a peripheral switching gate electrode, a pixel switching gate electrode, and a driving gate electrode on the first gate insulating layer, forming a low concentration doping region in each of the pixel switching semiconductor layer, the driving semiconductor layer, and the peripheral switching semiconductor layer by using a photosensitive layer formed on the pixel switching gate electrode, the driving gate electrode, and the peripheral switching gate electrode as a mask, and forming a second gate insulating layer covering the peripheral switching gate electrode, the pixel switching gate electrode, and the driving gate electrode. A length of the low concentration doping region formed in the peripheral switching semiconductor layer may be larger than a length of the low concentration doping regions formed in the pixel switching semiconductor layer and the driving semiconductor layer, respectively.

The forming of the low concentration doping region may include overetching the pixel switching gate electrode, the driving gate electrode, and the peripheral switching gate electrode by using the photosensitive layer as the mask, removing the photosensitive layer, and doping a low concentration impurity on each of the pixel switching semiconductor layer, the driving semiconductor layer, and the peripheral switching semiconductor layer by using the overetched pixel switching gate electrode, driving gate electrode, and peripheral switching gate electrode as the mask.

A doping degree of the peripheral switching low concentration doping region formed in the peripheral switching semiconductor layer may be larger than a doping degree of the pixel switching low concentration doping region and the driving low concentration doping region formed in the pixel switching semiconductor layer and the driving semiconductor layer, respectively.

The length of the pixel switching low concentration doping region formed in the pixel switching semiconductor layer may be larger than the length of the driving low concentration doping region formed in the driving semiconductor layer.

The doping degree of the pixel switching low concentration doping region formed in the pixel switching semiconductor layer may be larger than the doping degree of the driving low concentration doping region formed in the driving semiconductor layer.

The method may further include forming a storage capacitor overlapping the driving semiconductor layer.

The forming of the storage capacitor may include forming a first storage capacitive plate overlapping the driving semiconductor layer on the first gate insulating layer, and forming a second storage capacitive plate overlapping the first storage capacitive plate on the second gate insulating layer covering the first storage capacitive plate.

According to the embodiments of the present invention, it is possible to broaden a driving range of a driving transistor to display a lot of grayscales, ensure a predetermined charge mobility of a peripheral switching transistor of a peripheral portion, and reduce a leakage current of the peripheral switching transistor to improve a charging ability of the peripheral switching transistor by setting thicknesses of gate insulating layers of the peripheral portion and the pixel portion to be the same as each other, longitudinally forming a driving channel region of a driving semiconductor layer of a driving transistor of the pixel portion, and setting a length or a doping degree of a low concentration doping region of the peripheral switching transistor to be larger than the length or the doping degree of the low concentration doping region of the driving transistor and the pixel switching transistor.

Therefore, since the driving range of the gate voltage is broad in the driving transistor of the pixel portion, a grayscale of light emitted from an organic light emitting diode (OLED) can be more finely controlled by changing the magnitude of the gate voltage, and as a result, it is possible to increase a resolution of the organic light emitting diode display device and improve a display quality.

Further, it is possible to sufficiently ensure a storage capacitance even at a high resolution by forming a storage capacitor overlapping the driving semiconductor layer in order to ensure a region of the storage capacitor reduced by the driving semiconductor layer having a bent portion.

In addition, since an aging process used to control a leakage current of the switching transistor of the peripheral portion and the pixel portion is not added, manufacturing cost can be reduced.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
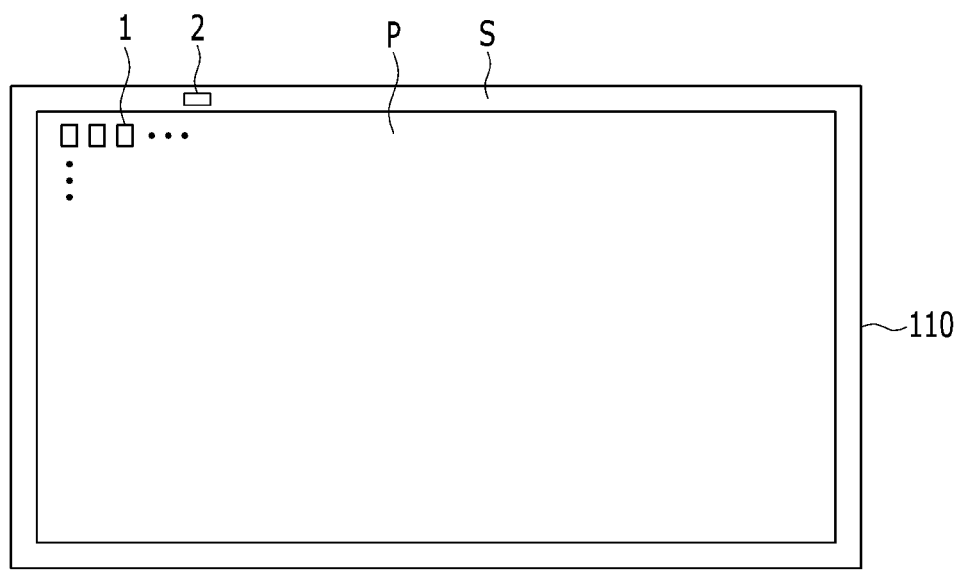
FIG. 1 is a top plan view of an organic light emitting diode display device constructed as an embodiment according to the principles of the present invention.

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, in the specification, the word "_on" means positioning on or below the object portion, but does not essentially mean positioning on the upper side of the object portion based on a gravity direction.

Further, in the specification, the word "on a flat surface" means when an object portion is viewed from the above, and the word "on a cross section" means when a cross section taken by vertically cutting an object portion is viewed from the side.

Then, an organic light emitting diode display device according to an exemplary embodiment will be described in detail with reference to FIGS. 1 to 8.

Figure 2:
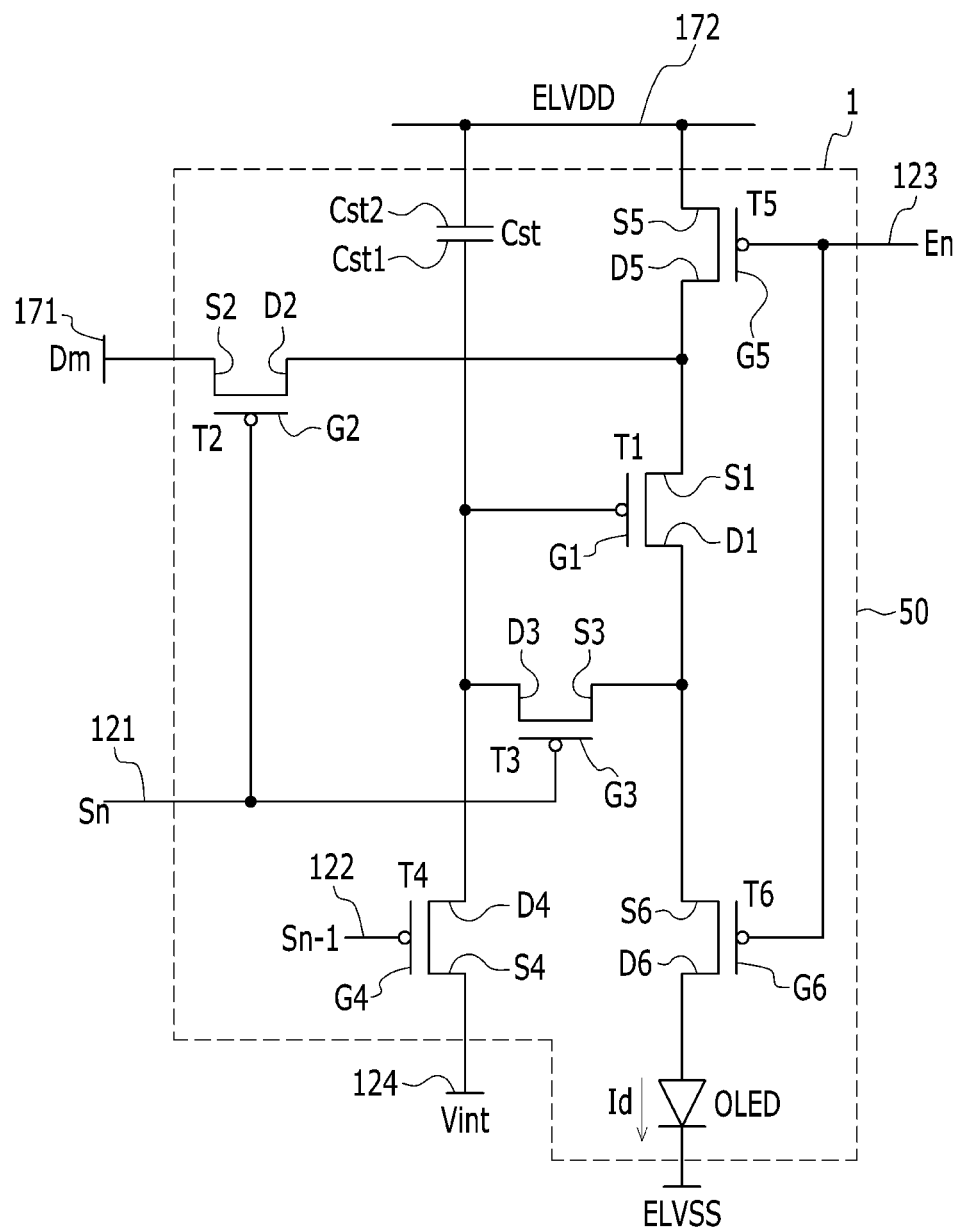
FIG. 2 is an equivalent circuit of one pixel of a pixel portion of the organic light emitting diode display device constructed as the embodiment according to the principles of the present invention.

FIG. 1 is a top plan view of an organic light emitting diode display device constructed as an embodiment according to the principles of the present invention, and FIG. 2 is an equivalent circuit of one pixel of a pixel portion of the organic light emitting diode display device according to the embodiment.

As illustrated in FIG. 1, the organic light emitting diode display device according to the exemplary embodiment includes a pixel portion P formed on a substrate 110 and including a plurality of pixels 1 formed of an organic light emitting diode (OLED), and a peripheral portion S surrounding the pixel portion P and including a plurality of peripheral circuits 2.

As illustrated in FIG. 2, one pixel 1 formed in the pixel portion P of the organic light emitting diode display device constructed as the embodiment according to the principles of the present invention includes a plurality of signal lines 121, 122, 123, 124, 171, and 172, and a plurality of transistors T1, T2, T3, T4, T5, and T6, a storage capacitor Cst, and an organic light emitting diode (OLED) connected to the plurality of signal lines.

The transistor includes a driving transistor (driving thin film transistor) T1, a pixel switching transistor (switching thin film transistor) T2, a compensation transistor T3, an initialization transistor T4, an operation control transistor T5, and a light emission control transistor T6.

The signal line includes a scan line 121 transferring a scan signal Sn, a prior scan line 122 transferring a prior scan signal Sn-1 to the initialization transistor T4, a light emission control line 123 transferring a light emission control signal En to the operation control transistor T5 and to the light emission control transistor T6, a data line 171 crossing the scan line 121 (refer to FIG. 3) and transferring a data signal Dm, a driving voltage line 172 transferring a driving voltage ELVDD and formed in almost parallel to the data line 171 (refer to FIG. 3), and an initialization voltage line 124 transferring an initialization voltage Vint initializing the driving transistor T1.

A gate electrode G1 of the driving transistor T1 is connected to an end Cst1 of the storage capacitor Cst, a source electrode S1 of the driving transistor T1 is connected via the operation control transistor T5 to the driving voltage line 172, and the drain electrode D1 of the driving transistor T1 is electrically connected via the light emission control transistor T6 to an anode of the organic light emitting diode (OLED).

The driving transistor T1 receives the data signal Dm according to switching operation of the pixel switching transistor T2 to supply a driving current Id to the organic light emitting diode (OLED).

A gate electrode G2 of the pixel switching transistor T2 is connected to the scan line 121, a source electrode S2 of the pixel switching transistor T2 is connected to the data line 171, and a drain electrode D2 of the pixel switching transistor T2 is connected via the operation control transistor T5 to the driving voltage line 172 while being connected to the source electrode S1 of the driving transistor T1. The pixel switching transistor T2 is turned-on according to the scan signal Sn transferred through the scan line 121 to perform switching operation transferring the data signal Dm transferred to the data line 171 to the source electrode of the driving transistor T1.

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to the end Cst1 of the storage capacitor Cst, a drain electrode D4 of the initialization transistor T4, and the gate electrode G1 of the driving transistor T1 together. The compensation transistor T3 is turned-on according to the scan signal Sn transferred through the scan line 121 to connect the gate electrode G1 and the drain electrode D1 of the driving transistor T1 to each other, thus performing diode-connection of the driving transistor T1.

A gate electrode G4 of the initialization transistor T4 is connected to the prior scan line 122, a source electrode S4 of the initialization transistor T4 is connected to the initialization voltage line 124, and the drain electrode D4 of the initialization transistor T4 is connected to the end Cst1 of the storage capacitor Cst, the drain electrode D3 of the compensation transistor T3, and the gate electrode G1 of the driving transistor T1 together. The initialization transistor T4 is turned-on according to the prior scan signal Sn-1 transferred through the prior scan line 122 to transfer the initialization voltage Vint to the gate electrode G1 of the driving transistor T1, thus performing an initialization operation initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the pixel switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned-on according to the light emission control signal En transferred through the light emission control line 123 to transfer the driving voltage ELVDD to the organic light emitting diode (OLED), thus allowing the driving current Id to flow in the organic light emitting diode (OLED).

Another end Cst2 of the storage capacitor Cst is connected to the driving voltage line 172, and a cathode of the organic light emitting diode (OLED) is connected to a common voltage ELVSS. Accordingly, the organic light emitting diode (OLED) receives a driving current Id from the driving transistor T1 to emit light, thereby displaying an image.

Hereinafter, a specific operation process of one pixel of the organic light emitting diode display device constructed as the embodiment according to the principles of the present invention will be described in detail.

First, a prior scan signal Sn-1 at a low level is supplied through the prior scan line 122 during an initialization period. Then, the initialization transistor T4 is turned-on corresponding to the prior scan signal Sn-1 at the low level, and the initialization voltage Vint is connected from the initialization voltage line 124 through the initialization transistor T4 to the gate electrode of the driving transistor T1 to initialize the driving transistor T1 by the initialization voltage Vint.

Subsequently, the scan signal Sn at the low level is supplied through the scan line 121 during a data programming period. Then, the pixel switching transistor T2 and the compensation transistor T3 are turned-on corresponding to the scan signal Sn at the low level.

In this case, the driving transistor T1 is diode-connected by the turned-on compensation transistor T3, and biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are applied to both ends of the storage capacitor Cst, and a charge corresponding to a difference between voltages at both ends is stored in the storage capacitor Cst. Subsequently, the level of the light emission control signal En supplied from the light emission control line 123 during the light emission period is changed from the high level to the low level. Then, the operation control transistor T5 and the light emission control transistor T6 are turned-on by the light emission control signal En at the low level during the light emission period.

Then, the driving current Id is generated according to a difference between the voltage of the gate electrode of the driving transistor T1 and the driving voltage ELVDD, and the driving current Id is supplied through the light emission control transistor T6 to the organic light emitting diode (OLED). The gate-source voltage Vgs of the driving transistor T1 is maintained at '(Dm+Vth)−ELVDD' by the storage capacitor Cst during the light emission period, and the driving current Id is proportional to a square of a value obtained by subtracting the threshold voltage from the source-gate voltage, that is, '$(Dm-ELVDD)^2$', according to a current-voltage relationship of the driving transistor T1. Accordingly, the driving current Id is determined regardless of the threshold voltage Vth of the driving transistor T1.

Then, a detailed structure of the pixel of the pixel portion of the organic light emitting diode display device illustrated in FIG. 2 and a detailed structure of the switching transistor of the peripheral portion will be described in detail with reference to FIGS. 3 to 8 and FIG. 2 together.

Figure 3:
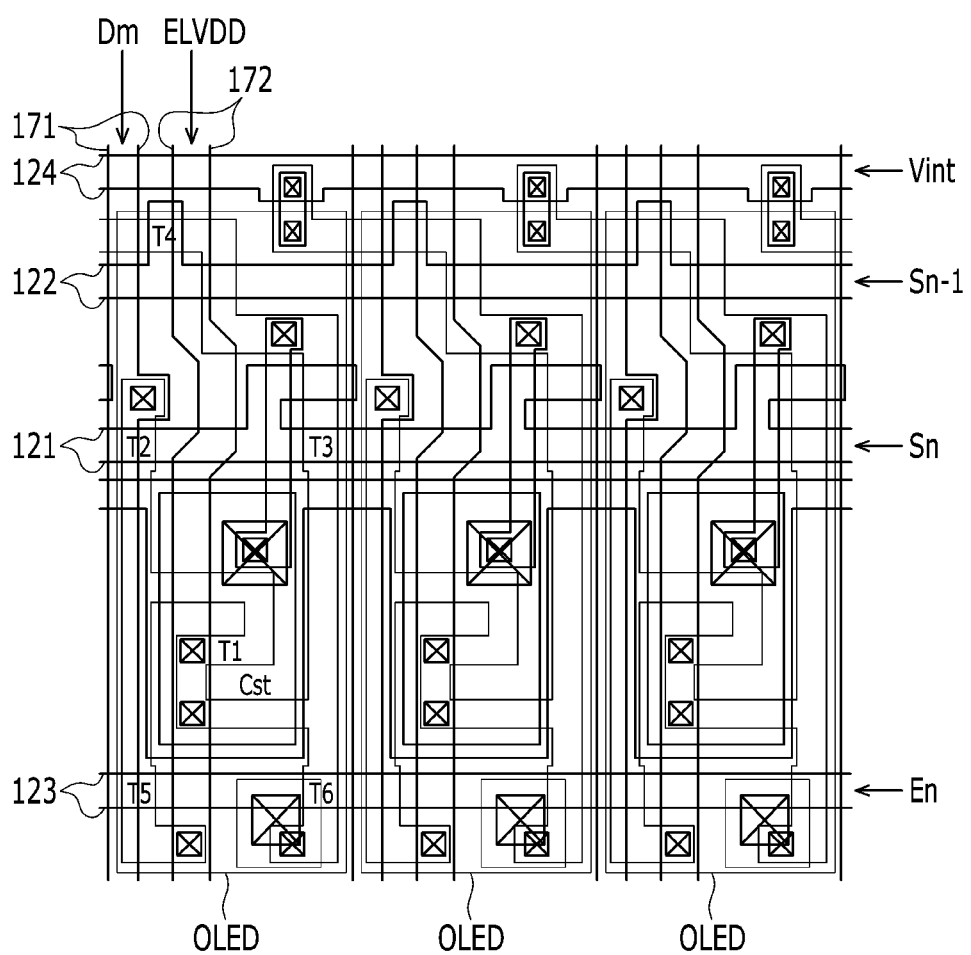
FIG. 3 is a layout view schematically illustrating a plurality of transistors and capacitors of the pixel portion of the organic light emitting diode display device constructed as the embodiment according to the principles of the present invention.
Figure 4:
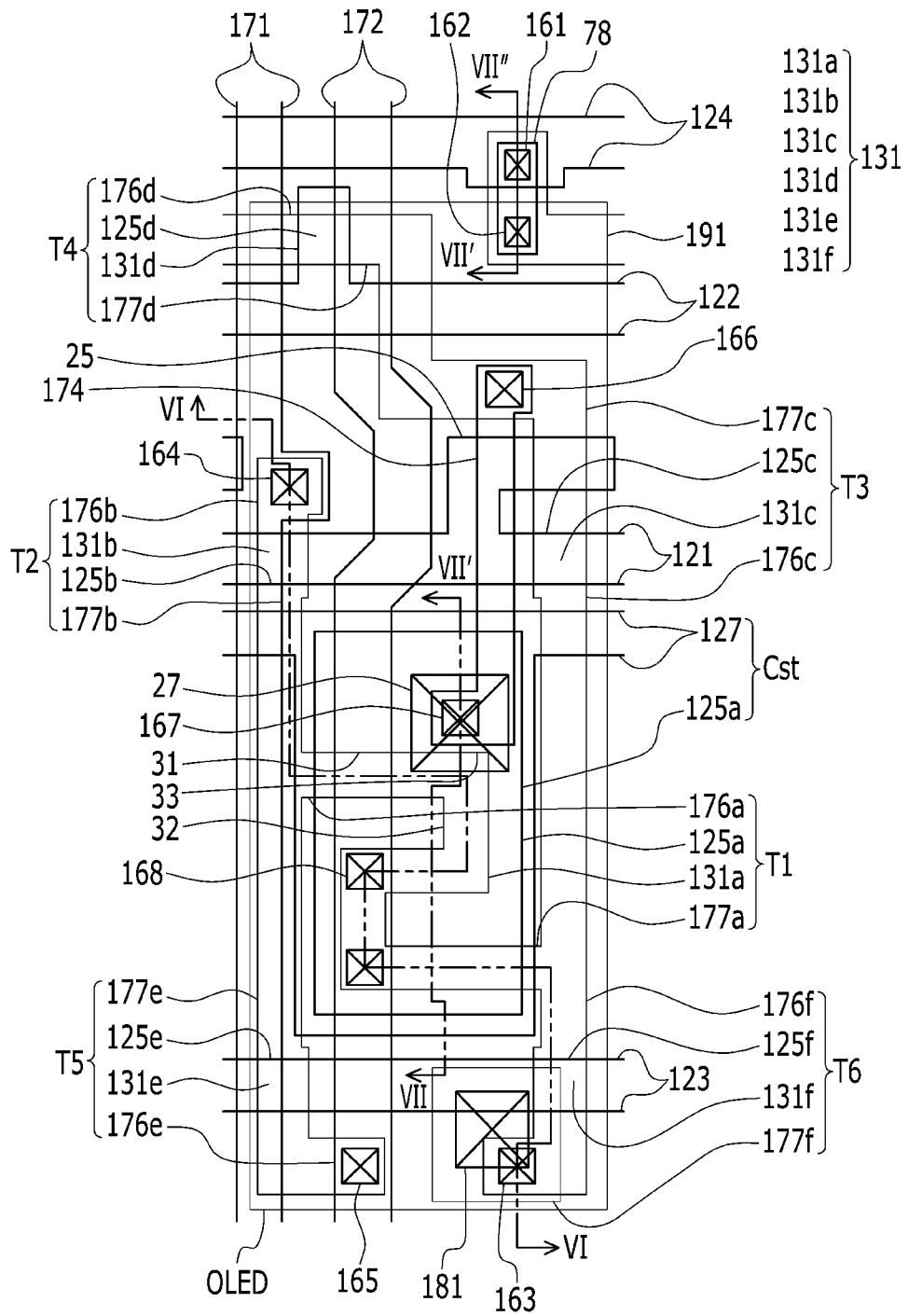
FIG. 4 is a specific layout view of one pixel of FIG. 3.
Figure 5:
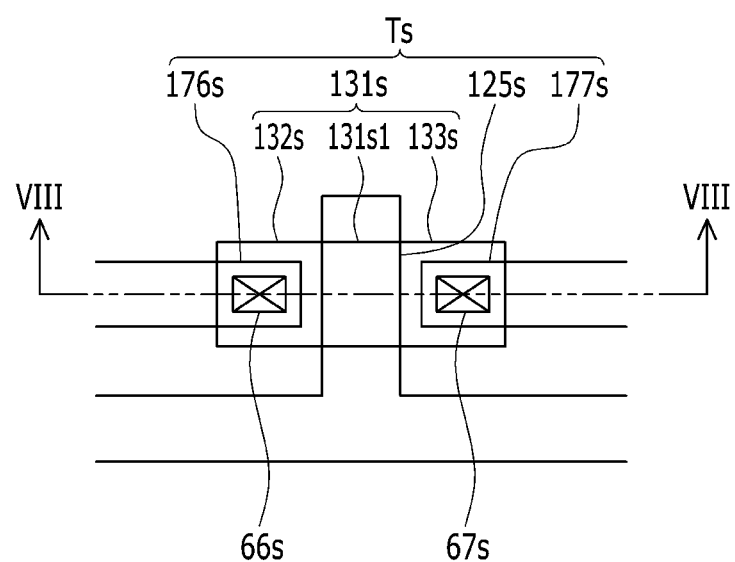
FIG. 5 is a view schematically illustrating a switching transistor of a peripheral portion of the organic light emitting diode display device constructed as the embodiment according to the principles of the present invention.
Figure 6:
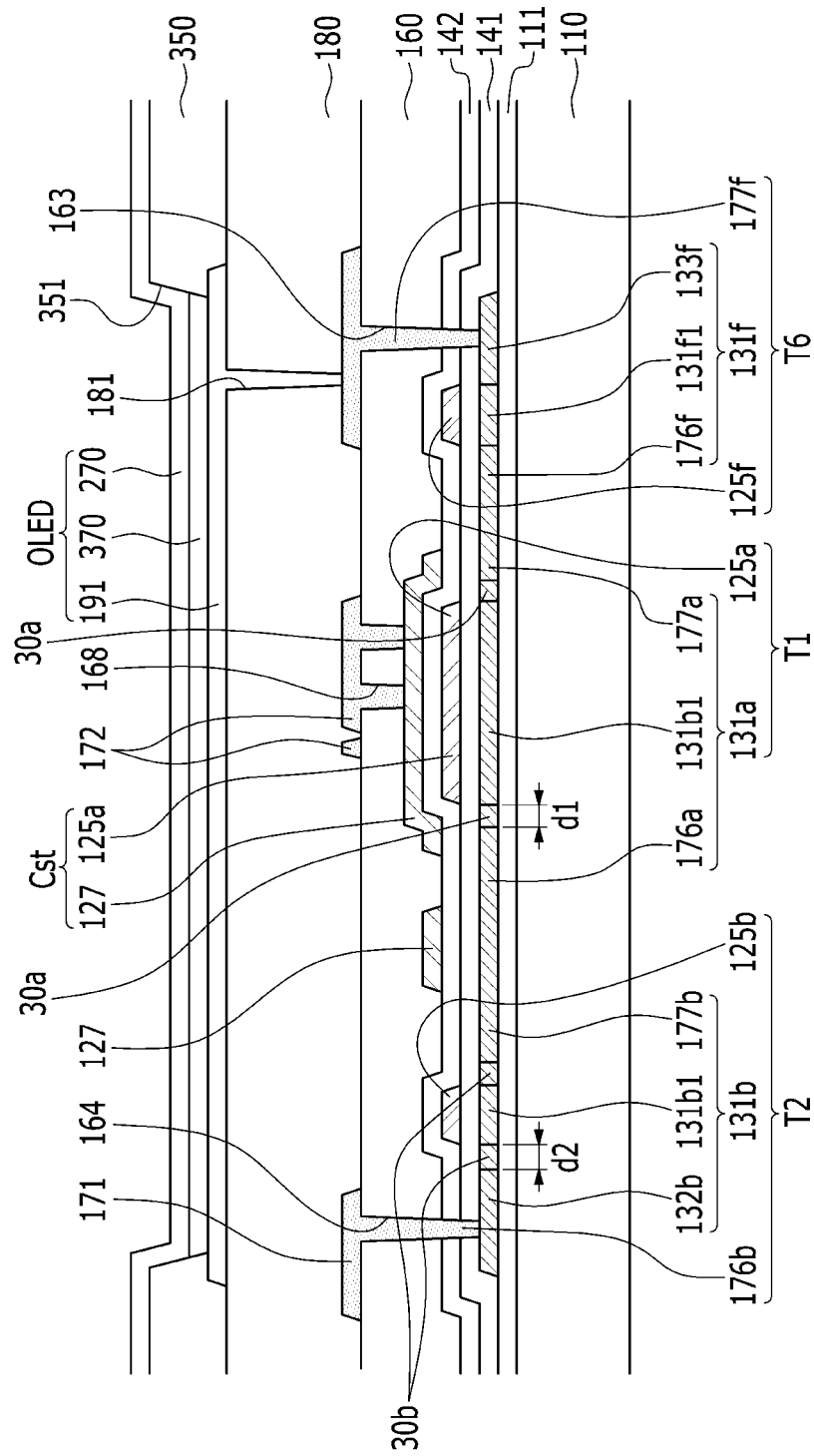
FIG. 6 is a cross-sectional view of the organic light emitting diode display device of FIG. 4, which is taken along line VI-VI.
Figure 7:
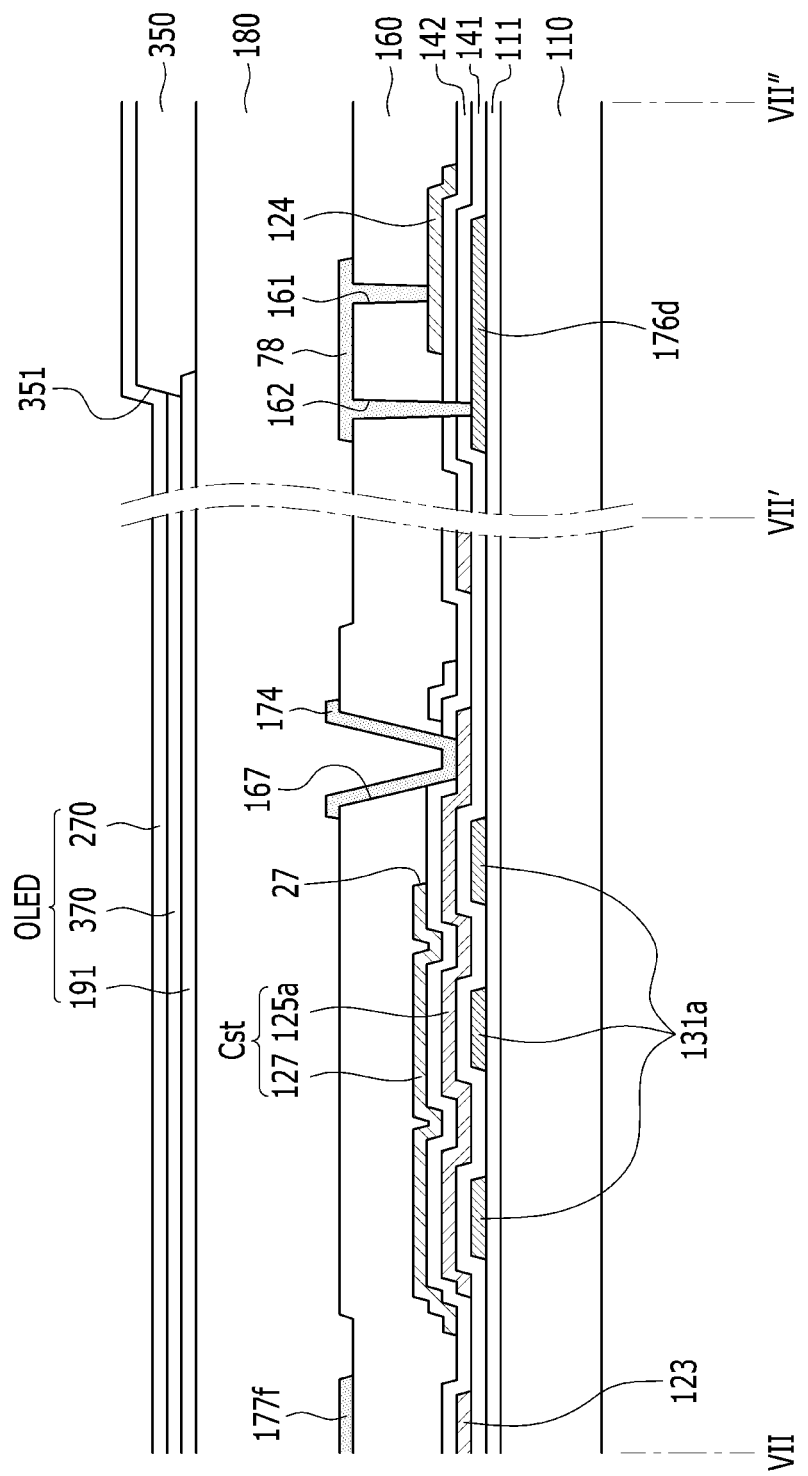
FIG. 7 is a cross-sectional view of the organic light emitting diode display device of FIG. 4, which is taken along lines VII-VII' and VII'-VII"
Figure 8:
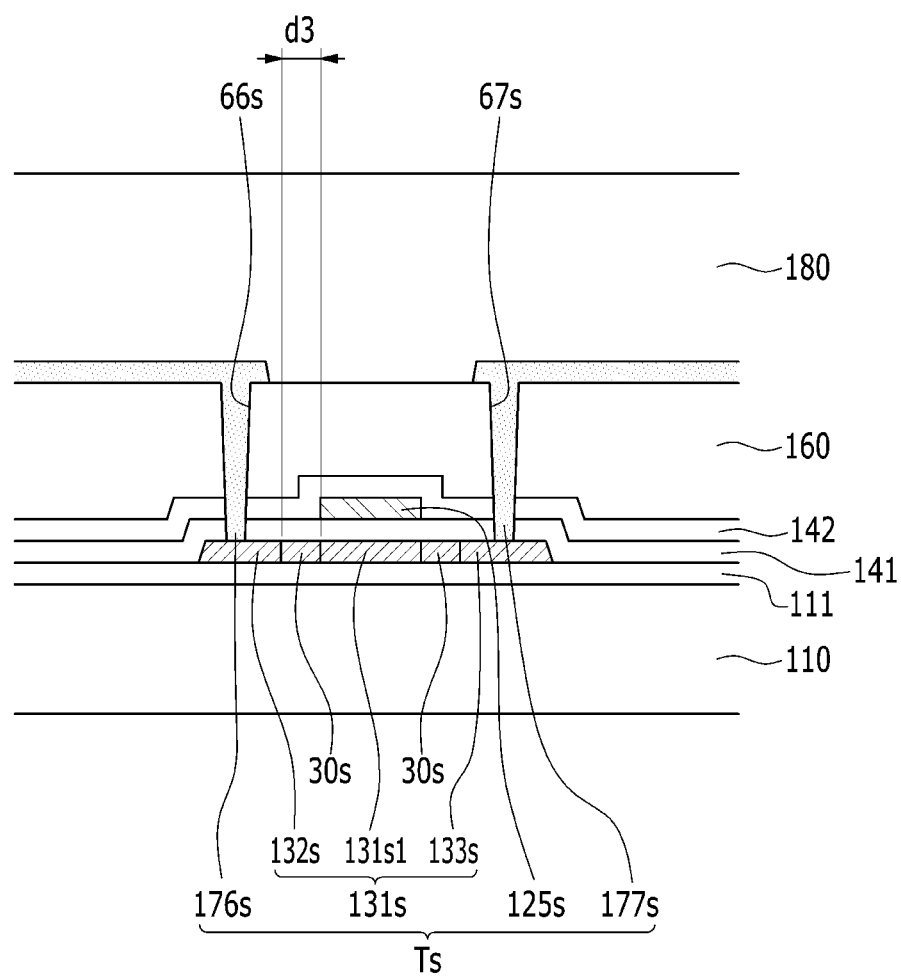
FIG. 8 is a cross-sectional view taken along line VIII-VIII of FIG. 5.

FIG. 3 is a layout view schematically illustrating a plurality of transistors and capacitors of the pixel portion of the organic light emitting diode display device constructed as the embodiment according to the principles of the present invention, FIG. 4 is a specific layout view of one pixel of FIG. 3, FIG. 5 is a view schematically illustrating a transistor of a peripheral portion of the organic light emitting diode display device according to the exemplary embodiment, FIG. 6 is a cross-sectional view of the organic light emitting diode display device of FIG. 4, which is taken along line VI-VI, FIG. 7 is a cross-sectional view of the organic light emitting diode display device of FIG. 4, which is taken along lines VII-VII' and VII'-VII", and FIG. 8 is a cross-sectional view taken along line VIII-VIII of FIG. 5.

As illustrated in FIG. 3, the pixel of the pixel portion P of the organic light emitting diode display device constructed as the embodiment according to the principles of the present invention includes the scan line 121, the prior scan line 122, the light emission control line 123, and the initialization voltage line 124 applying the scan signal Sn, the prior scan signal Sn-1, the light emission control signal En, and the initialization voltage Vint, respectively, and formed in a row direction The pixel of the pixel portion P of the organic light emitting diode display device also includes the data line 171 and the driving voltage line 172 crossing all the scan line 121, the prior scan line 122, the light emission control line 123, and the initialization voltage line 124 and applying the data signal Dm and the driving voltage ELVDD, respectively, to the pixel.

Further, the driving transistor T1, the pixel switching transistor T2, the compensation transistor T3, the initialization transistor T4, the operation control transistor T5, the light emission control transistor T6, the storage capacitor Cst, and the organic light emitting diode (OLED) are formed in the pixel.

As illustrated in FIGS. 3 and 4, the driving transistor T1, the pixel switching transistor T2, the compensation transistor T3, the initialization transistor T4, the operation control transistor T5, and the light emission control transistor T6 formed in the pixel portion P are formed along the semiconductor layer 131, and the semiconductor layer 131 is formed to be bent in various shapes. The semiconductor layer 131 may be formed of polysilicon or oxide semiconductor. The oxide semiconductor may include any one of oxides of zinc (Zn), gallium (Ga), tin (Sn), or indium (In) as a basis, or zinc oxide (ZnO), indium-gallium-zinc oxide (InGaZnO$_4$), indium-zinc oxide (Zn—In—O), or zinc-tin oxide (Zn—Sn—O) that are complex oxides thereof. In the case where the semiconductor layer 131 is formed of the oxide semiconductor, a separate protective layer may be added to protect the oxide semiconductor that is weak to an external environment such as high temperatures.

The semiconductor layer 131 includes a channel region not doped with an impurity and a source region and a drain region formed at opposite sides of the channel region to be doped with the impurity. Herein, the impurity is changed according to a kind of transistor, and an N type impurity or a P type impurity is feasible.

As shown in FIG. 4, the semiconductor layer 131 includes a driving semiconductor layer 131a formed in the driving transistor T1, a pixel switching semiconductor layer 131b formed in the pixel switching transistor T2, a compensation semiconductor layer 131c formed in the compensation transistor T3, an initialization semiconductor layer 131d formed in the initialization transistor T4, an operation control semiconductor layer 131e formed in the operation control transistor T5, and a light emission control semiconductor layer 131f formed in the light emission control transistor T6.

Further, as shown in FIG. 5, the semiconductor layer 131 also includes a peripheral switching semiconductor layer 131s of a peripheral switching transistor Ts formed in a peripheral circuit 2 of the peripheral portion S.

Referring back to FIG. 4, the driving transistor T1 includes the driving semiconductor layer 131a, a driving gate electrode 125a, a driving source electrode 176a, and a driving drain electrode 177a. The driving semiconductor layer 131a is bent. The driving semiconductor layer 131a includes a plurality of first extension portions 31 extending in a first direction, a plurality of second extension portions 32 extending in a second direction that is different from the first direction, and a plurality of bent portions 33 connecting the first extension portion 31 and the second extension portion 32. Accordingly, the driving semiconductor layer 131a may be disposed in a zigzag form. The driving semiconductor layer 131a illustrated in FIGS. 3 and 4 includes three first extension portions 31, two second extension portions 32, and four bent portions 33. Accordingly, the driving semiconductor layer 131a may be longitudinally disposed in a meandering or reversing ox bow form, such as a 'ㄹ' shape. The first extension portion 31 may be perpendicular to the second extension portion 32, and the bent portion 33 may be formed in a right angle connecting the first extension portion 31 and the second extension portion 32.

As described above, the driving semiconductor layer 131a may be longitudinally formed in a narrow space by forming the driving semiconductor layer 131a including a plurality of bent portions 33. Thus, a driving channel region 131a1 of the driving semiconductor layer 131a may be longitudinally formed along the path of the driving semiconductor layer 131a. On the other hand, if the driving semiconductor layer is extended only in one direction, for example, the first direction, without any bent portions, the driving channel region formed in the same space will have a much shorter length than the driving channel region 131a1 shown in FIG. 4. Accordingly, the driving range of the gate voltage applied to the driving gate electrode 125a of the driving transistor T1 formed of the driving semiconductor layer 131a including the plurality of bent portions 33 is broadened, comparing to the driving range of gate voltage applied to the driving gate electrode of a driving transistor formed of the driving semiconductor layer without any bent portions, if the width of the driving semiconductor layer of the two transistors is the same. Therefore, since the driving range of the gate voltage of the driving transistor T1 shown in FIG. 4 is broadened, a grayscale of light emitted from an organic light emitting diode (OLED) can be more finely controlled by changing the magnitude of the gate voltage, and as a result, it is possible to increase a resolution of the organic light emitting diode display device and improve a display quality.

In the driving semiconductor layer 131a, the first extension portion 31, the second extension portion 32, and the bent portion 33 may be variously disposed to implement various exemplary embodiments such as 'S', 'M', and 'W'.

Meanwhile, the driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a.

The storage capacitor Cst is formed on the driving gate electrode 125a while overlapping the driving gate electrode 125a on a cross section. The storage capacitor Cst includes a first storage capacitive plate and a second storage capacitive plate 127 with the second gate insulating layer 142 interposed therebetween. Herein, the driving gate electrode 125a also plays a role of the first storage capacitive plate, the second gate insulating layer 142 becomes a dielectric material, and a storage capacitance is determined by the charged accumulated in the storage capacitor Cst and the voltage between the first storage capacitive plate, i.e., the driving gate electrode 125a, and the second storage capacitive plate 127.

The first storage capacitive plate, i.e., the driving gate electrode 125a, is separated from the adjacent pixel to form a rectangle, and is formed of the same material as the scan line 121, the prior scan line 122, the light emission control line 123, a switching gate electrode 125b of the pixel switching transistor T2, a compensation gate electrode 125c of the compensation transistor T3, an operation control gate electrode 125e of the operation control transistor T5, an initialization gate electrode 125d of the initialization transistor T4, a light emission control gate electrode 125f of the light emission control transistor T6, on the same layer thereas.

The second storage capacitive plate 127 is connected to the adjacent pixel, and is formed of the same material as the initialization voltage line 124 on the same layer thereas.

As described above, it is possible to ensure the storage capacitance even at a high resolution by forming the storage capacitor overlapping the driving semiconductor layer 131a in order to ensure a region of the storage capacitor reduced by the driving semiconductor layer 131a having the bent portion.

The pixel switching transistor T2 includes the pixel switching semiconductor layer 131b, the pixel switching gate electrode 125b, a pixel switching source electrode 176b, and a pixel switching drain electrode 177b. The switching source electrode 176b is a portion protruding from the data line 171, and the switching drain electrode 177b corresponds to a switching drain region 177b doped with an impurity in the switching semiconductor layer 131b.

The compensation transistor T3 includes the compensation semiconductor layer 131c, the compensation gate electrode 125c, a compensation source electrode 176c, and a compensation drain electrode 177c, the compensation source electrode 176c corresponds to the compensation source region 176c doped with the impurity in the compensation semiconductor layer 131c, and the compensation drain electrode 177c corresponds to the compensation drain region 177c doped with the impurity in the compensation semiconductor layer 131c. The compensation gate electrode 125c prevents a leakage current by forming a separate dual gate electrode 25.

The initialization transistor T4 includes the initialization semiconductor layer 131d, the initialization gate electrode 125d, an initialization source electrode 176d, and an initialization drain electrode 177d. The initialization drain electrode 177d corresponds to the initialization drain region 177d doped with the impurity in the initialization semiconductor layer 131d. The initialization source electrode 176d is connected through an initialization connection line 78 to the initialization voltage line 124. An end of the initialization connection line 78 is connected through a contact hole 161 formed in an interlayer insulating layer 160 to the initialization voltage line 124, and another end of the initialization connection line 78 is connected through the contact hole 162 formed in the first gate insulating layer 141, the second gate insulating layer 142, and the interlayer insulating layer 160 to the initialization source electrode 176d.

The operation control transistor T5 includes an operation control semiconductor layer 131e, an operation control gate electrode 125e, an operation control source electrode 176e, and an operation control drain electrode 177e. The operation control source electrode 176e is a portion of the driving voltage line 172, and the operation control drain electrode 177e corresponds to the operation control drain region 177e doped with the impurity in the operation control semiconductor layer 131e.

The light emission control transistor T6 includes the light emission control semiconductor layer 131f, the light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f.

An end of the driving semiconductor layer 131a of the driving transistor T1 is connected to the switching semiconductor layer 131b and the compensation semiconductor layer 131c, and another end of the driving semiconductor layer 131a is connected to the operation control semiconductor layer 131e and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

The first storage capacitive plate, i.e., the driving gate electrode 125a, of the storage capacitor Cst is connected through the connection member 174 to the compensation drain electrode 177c and the initialization drain electrode 177d together. The connection member 174 is formed on the same layer as the data line 171, an end of the connection member 174 is connected through a contact hole 166 formed in the first gate insulating layer 141, the second gate insulating layer 142, and the interlayer insulating layer 160 to the compensation drain electrode 177c and the initialization drain electrode 177d, and another end of the connection member 174 is connected through a contact hole 167 formed in the second gate insulating layer 142 and the interlayer insulating layer 160 to the first storage capacitive plate, i.e., the driving gate electrode 125a. In this case, another end of the connection member 174 is connected through a storage opening 27 formed in the second storage capacitive plate 127 to the first storage capacitive plate, i.e., the driving gate electrode 125a.

The second storage capacitive plate 127 of the storage capacitor Cst is connected through a contact hole 168 formed in the interlayer insulating layer 160 to a driving voltage line 172.

The pixel switching transistor T2 is used as a switching diode selecting the pixel that is to emit light. The switching gate electrode 125b is connected to the scan line 121, the switching source electrode 176b is connected to the data line 171, and the switching drain electrode 177b is connected to the driving transistor T1 and the operation control transistor T5. In addition, the light emission control drain electrode 177f of the light emission control transistor T6 is directly connected through a contact hole 181 formed in the protective layer 180 to a pixel electrode 191 of the organic light emitting diode (OLED).

Meanwhile, the peripheral switching transistor Ts includes the peripheral switching semiconductor layer 131s, the peripheral switching gate electrode 125s, the peripheral switching source electrode 176s, and the peripheral switching drain electrode 177s. The peripheral switching source electrode 176s and the peripheral switching drain electrode 177s face each other based on the flat surface type peripheral switching gate electrode 125s.

The peripheral switching transistor Ts is used as a switching diode switching the peripheral circuit 2 such as a driver positioned on the peripheral portion S.

Hereinafter, a structure of a pixel portion and a peripheral portion of the organic light emitting diode display device according to the exemplary embodiment will be specifically described according to the lamination order with reference to referring to FIGS. 4 to 8.

In this case, the structure of the transistor will be described based on the driving transistor T1, the pixel switching transistor T2, and the light emission control transistor T6 of the pixel portion P, and the peripheral switching transistor Ts of the peripheral portion S as a key constitution. In addition, the remaining transistors T3, T4, and T5 are almost the same as the laminate structures of the driving transistor T1, the pixel switching transistor T2, and the light emission control transistor T6, and thus are not described in further detail.

A buffer layer 111 is formed on the substrate 110, and the substrate 110 is formed of an insulating substrate made of glass, quartz, ceramics, plastics or the like.

The driving semiconductor layer 131a, the pixel switching semiconductor layer 131b, and the light emission control semiconductor layer 131f are formed on the buffer layer 111 of the pixel portion P. The driving semiconductor layer 131a includes the driving source region 176a and the driving drain region 177a facing each other with the driving channel region 131a1 and the driving channel region 131a1 interposed therebetween, and a driving low concentration doping region (lightly doped drain, LDD) 30a preventing a leakage current in an off state is formed between the driving channel region 131a1 and the driving source region 176a and between the driving channel region 131a1 and the driving drain region 177a. The doping degree of the driving low concentration doping region 30a is lower than the doping degree of the driving source region 176a and the driving drain region 177a. The doping degree means an amount of doped impurity per unit area of a region.

The pixel switching semiconductor layer 131b includes the pixel switching source region 132b and the pixel switching drain region 177b facing each other with the pixel switching channel region 131b1 and the pixel switching channel region 131b1 interposed therebetween. A pixel switching low concentration doping region 30b is formed between the pixel switching channel region 131b1 and the pixel switching source region 132b and between the pixel switching channel region 131b1 and the pixel switching drain region 177b. The doping degree of the pixel switching low concentration doping region 30b is lower than the pixel switching source region 132b and the pixel switching drain region 177b.

The light emission control transistor T6 includes a light emission control channel region 131f1, a light emission control source region 176f, and a light emission control drain region 133f.

Since the driving semiconductor layer 131a includes a plurality of bent portions 33 to be formed in a zigzag form, specifically, in a meandering or reversing ox bow form, such as a '彐' shape, the driving semiconductor layer 131a may be longitudinally formed in a narrow space. Accordingly, since the driving channel region 131a1 of the driving semiconductor layer 131a may be longitudinally formed, the driving range of the gate voltage applied to the driving gate electrode 125a is broadened.

The length d2 of the pixel switching low concentration doping region 30b formed in the pixel switching semiconductor layer 131b may be larger than the length d1 of the driving low concentration doping region 30a formed in the driving semiconductor layer 131a. Therefore, the length of the pixel switching channel region 131b1 of the pixel switching semiconductor layer 131b is smaller than the length of the driving channel region 131a1 of the driving semiconductor layer 131a, and thus, a leakage current of the pixel switching transistor T2 in which the leakage current may frequently occur may be reduced. Further, the doping degree of the pixel switching low concentration doping region 30b formed in the pixel switching semiconductor layer 131b may be larger than the doping degree of the driving low concentration doping region 30a formed in the driving semiconductor layer 131a. The doping degree means an amount of doped impurity per unit area of a region. Accordingly, the leakage current of the pixel switching transistor T2 may be reduced as compared to the driving transistor T1.

Further, a peripheral switching semiconductor layer 131s is formed on the buffer layer 111 of the peripheral portion S. The peripheral switching semiconductor layer 131s includes a peripheral switching channel region 131s1, and a peripheral switching source region 132s and a peripheral switching drain region 133s facing each other with the peripheral switching channel region 131s1 interposed therebetween, and a peripheral switching low concentration doping region 30s is formed between the peripheral switching channel region 131s1 and the peripheral switching source region 132s and between the peripheral switching channel region 131s1 and the peripheral switching drain region 133s. The doping degree of the peripheral switching low concentration doping region 30s is lower than the peripheral switching source region 132s and the peripheral switching drain region 133s.

The length d3 of the peripheral switching low concentration doping region 30s formed in the peripheral switching semiconductor layer 131s may be larger than the lengths d1 and d2 of the pixel switching low concentration doping region 30b and the driving low concentration doping region 30a respectively formed in the pixel switching semiconductor layer 131b and the driving semiconductor layer 131a. Therefore, it is possible to improve a charging ability of the peripheral switching transistor Ts by reducing the leakage current of the peripheral switching transistor Ts.

Further, the doping degree of the peripheral switching low concentration doping region 30s formed in the peripheral switching semiconductor layer 131s may be larger than the doping degree of the pixel switching low concentration doping region 30b and the driving low concentration doping region 30a respectively formed in the pixel switching semiconductor layer 131b and the driving semiconductor layer 131a. Therefore, it is possible to improve a charging ability of the peripheral switching transistor Ts by reducing the leakage current of the peripheral switching transistor Ts.

As described above, it is possible to broaden the driving range of the driving transistor T1 to display a lot of grayscales, ensure a predetermined charge mobility of the peripheral switching transistor Ts of the peripheral portion S, and reduce the leakage current of the peripheral switching transistor Ts to improve the charging ability of the peripheral switching transistor Ts by setting thicknesses of the peripheral portion S and the first gate insulating layer 141 of the pixel portion P to be the same as each other, longitudinally forming the driving channel region 131a1 of the driving semiconductor layer 131a of the driving transistor T1 of the pixel portion P, and setting the length d3 or the doping degree of the peripheral switching low concentration doping region 30s of the peripheral switching transistor Ts to be larger than the lengths d1 and d2 or the doping degree of the driving low concentration doping region 30a and the pixel switching low concentration doping region 30b of the driving transistor T1 and the pixel switching transistor T2.

The first gate insulating layer 141 that is formed of silicon nitride ($SiN_x$), silicon oxide ($SiO_2$), or the like is formed on the pixel switching semiconductor layer 131b, the driving semiconductor layer 131a, and the light emission control semiconductor layer 131f of the pixel portion P, and on the peripheral switching semiconductor layer 131s of the peripheral portion S.

The first gate wires including the scan line 121 including the driving gate electrode 125a, the pixel switching gate electrode 125b, and the compensation gate electrode 125c, the prior scan line 122 including the initialization gate electrode 125d, and the light emission control line 123 including the operation control gate electrode 125e and the light emission control gate electrode 125f are formed on the first gate insulating layer 141 of the pixel portion P. In addition, the first gate wire including the peripheral switching gate electrode 125s is formed at a position overlapping the peripheral switching semiconductor layer 131s on the first gate insulating layer 141 of the peripheral portion S.

The driving gate electrode 125a is separated from the scan line 121, and the floating gate electrode 25 overlaps the driving channel region 131a1 of the driving semiconductor layer 131a. In addition, the pixel switching gate electrode 125b is connected to the scan line 121, and the pixel switching gate electrode 125b overlaps the pixel switching channel region 131b1 of the pixel switching semiconductor layer 131b. In addition, the light emission control gate electrode 125f overlaps the light emission control channel region 131f1 of the light emission control semiconductor layer 131f.

In this case, in the peripheral switching transistor Ts, only the first gate insulating layer 141 is formed between the peripheral switching gate electrode 125s and the peripheral switching semiconductor layer 131s, rapid switching operation can be performed because the charge mobility is high, but the leakage current may easily occur. However, the leakage current of the peripheral switching transistor Ts may be reduced to improve the charging ability of the peripheral switching transistor Ts by setting the length d3 or the doping degree of the peripheral switching low concentration doping region 30s of the peripheral switching transistor Ts to be larger than the lengths d1 and d2 or the doping degree of the driving low concentration doping region 30a and the pixel switching low concentration doping region 30b of the driving transistor T1 and the pixel switching transistor T2.

Further, in the pixel switching transistor T2 and the driving transistor T1, only the first gate insulating layer 141 is formed between the pixel switching gate electrode 125b and the pixel switching semiconductor layer 131b and between the driving gate electrode 125a and the driving semiconductor layer 131a, but in the driving transistor T1, since the length of the driving channel region 131a1 of the driving semiconductor layer 131a is relatively large by forming the driving channel region 131a1 as discussed above, the driving range of the gate voltage applied to the driving gate electrode 125a may be broadened to more finely control the grayscale of light emitted from the organic light emitting diode (OLED).

The second gate insulating layer 142 is formed of silicon nitride ($SiN_x$), silicon oxide ($SiO_2$), or the like on the first gate wires 125a, 125b, 125c, 125d, 125e, 125f, 121, 122, 123, and 125s and the first gate insulating layer 141 of the pixel portion P and the peripheral portion S.

Second gate wires including the second storage capacitive plate 127 and the initialization voltage line 124 are formed on the second gate insulating layer 142 of the pixel portion P. The second storage capacitive plate 127 overlaps the first storage capacitive plate, i.e., the driving gate electrode 125a, to form the storage capacitor Cst, and the first storage capacitive plate, i.e., the driving gate electrode 125a, overlaps the driving semiconductor layer 131a. As described above, it is possible to ensure a storage capacitance even at a high resolution at which the size of the pixel is reduced by ensuring a region of the storage capacitor Cst reduced by the driving semiconductor layer 131a having the bent portion 33 by forming the storage capacitor Cst overlapping the driving semiconductor layer 131a.

Meanwhile, the interlayer insulating layer 160 is formed on the second gate insulating layer 142, the second storage capacitive plate 127, and the initialization voltage line 124. The first gate insulating layer 141, the second gate insulating layer 142, and the interlayer insulating layer 160 have a contact hole 163 through which the light emission control drain region 133f of the light emission control semiconductor layer 131f is exposed together. Like the first gate insulating layer 141 and the second gate insulating layer 142, the interlayer insulating layer 160 is made of a ceramic-based material such as silicon nitride ($SiN_x$) or silicon oxide ($SiO_2$).

Data wires including the data line 171 including the pixel switching source electrode 176b, the driving voltage line 172, the connection member 174, and the light emission control drain electrode 177f are formed on the interlayer insulating layer 160 of the pixel portion P, and the peripheral switching source electrode 176s and the peripheral switching drain electrode 177s are formed on the interlayer insulating layer 160 of the peripheral portion S.

In addition, the pixel switching source electrode 176b and the light emission control drain electrode 177f are respectively connected through the contact holes 164 and 163 formed in the interlayer insulating layer 160, the first gate insulating layer 141, the second gate insulating layer 142, and the third gate insulating layer 143 to the pixel switching source region 131b1 of the pixel switching semiconductor layer 131b and the light emission control drain region 133f of the light emission control semiconductor layer 131f, and the peripheral switching source electrode 176s and the peripheral switching drain electrode 177s are connected through contact holes 66s and 67s formed in the interlayer insulating layer 160, the first gate insulating layer 141, and the second gate insulating layer 142 to the peripheral switching source region 132s and the peripheral switching drain region 133s of the peripheral switching semiconductor layer 131s, respectively.

A protective layer 180 covering the data wires 171, 172, 174, and the pixel switching source electrode 176b, the light emission control drain electrode 177f, the peripheral switching source electrode 176s, and the peripheral switching drain electrode 177s is formed on the interlayer insulating layer 160. A pixel electrode 191 is formed on the protective layer 180 of the pixel portion P. The pixel electrode 191 is connected through the contact hole 181 formed in the protective layer 180 to the light emission control drain electrode 177f.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of resins such as polyacrylates and polyimides or silica-based inorganic materials.

An organic emission layer 370 is formed on the pixel electrode 191 exposed through the barrier rib opening 351, and the common electrode 270 is formed on the organic emission layer 370. As described above, the organic light emitting diode (OLED) including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the exemplary embodiment according to the present invention is not limited thereto, and the pixel electrode 191 may be the cathode and the common electrode 270 may be the anode according to the driving method of the organic light emitting diode display device. Holes and electrons are injected from the pixel electrode 191 and the common electrode 270 into the organic emission layer 370, and when an exciton that is bonded to the injected holes and electrons falls from an exited state to a bottom state, light is emitted.

The organic emission layer 370 is formed of a low molecular weight organic material or a high molecular weight organic material such as PEDOT (poly 3,4-ethylenedioxythiophene). Further, the organic emission layer 370 may be formed of a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 710 that is the anode, and the hole transport layer HTL, the emission layer, the electron transport layer ETL, and the electron injection layer EIL are sequentially laminated thereon.

The organic emission layer 370 may include a red organic emission layer emitting light having a red color, a green organic emission layer emitting light having a green color, and a blue organic emission layer emitting light having a blue color, and the red organic emission layer, the green organic emission layer, and the blue organic emission layer are respectively formed in a red pixel, a green pixel, and a blue pixel to implement a color image.

Further, the organic emission layer 370 may implement the color image by laminating all of the red organic emission layer, the green organic emission layer, and the blue organic emission layer in the red pixel, the green pixel, and the blue pixel together, and forming a red color filter, a green color filter, and a blue color filter for each pixel. As another example, a white organic emission layer emitting light having a white color may be formed in the entire red pixel, the green pixel, and the blue pixel, and the red color filter, the green color filter, and the blue color filter may be formed for each pixel to implement the color image. In the case where the color image is implemented by using the white organic emission layer and the color filter, a deposition mask for forming the red organic emission layer, the green organic emission layer, and the blue organic emission layer does not need to be used, which is advantageous to improve the resolution.

Since the common electrode 270 is formed of a reflective conductive material, a rear surface light emission type organic light emitting diode display device is obtained. Material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

Hereinafter, a method of manufacturing the organic light emitting diode display device according to the exemplary embodiment will be described in detail with reference the drawings.

Figure 9:
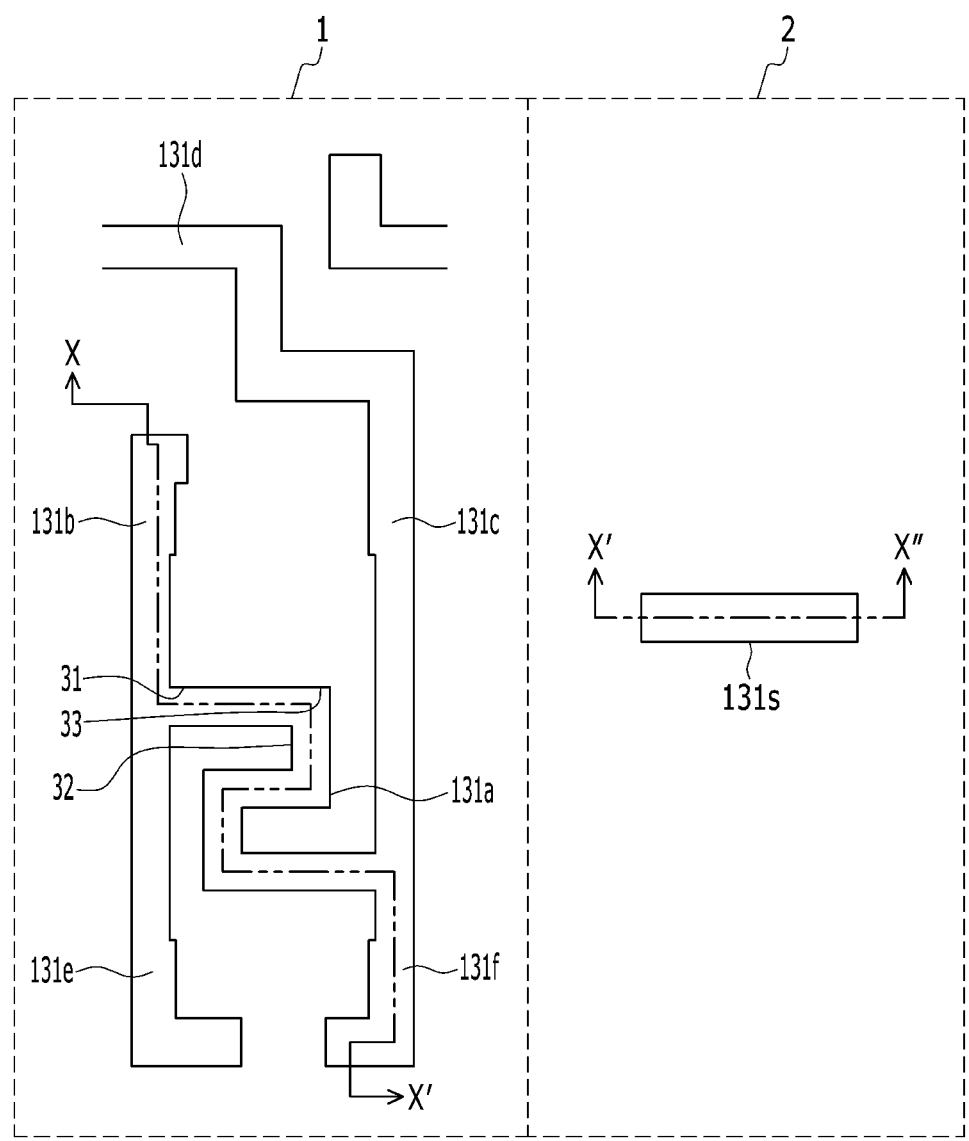
FIGS. 9, 11, and 14 are layout views sequentially illustrating a method of manufacturing the organic light emitting diode display device constructed as the embodiment according to the principles of the present invention.
Figure 10:
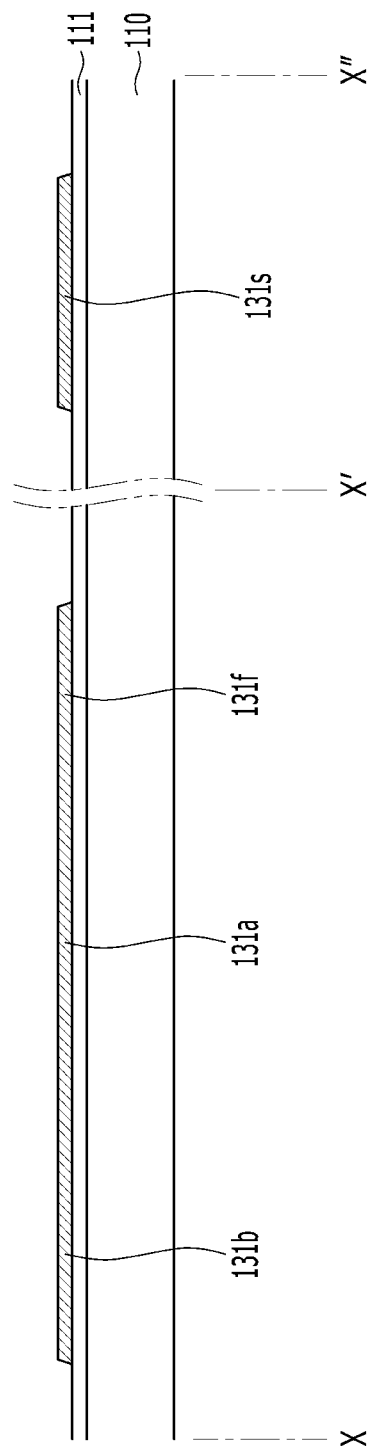
FIG. 10 is a cross-sectional view of the organic light emitting diode display device of FIG. 9, which is taken along lines X-X' and X'-X"
Figure 11:
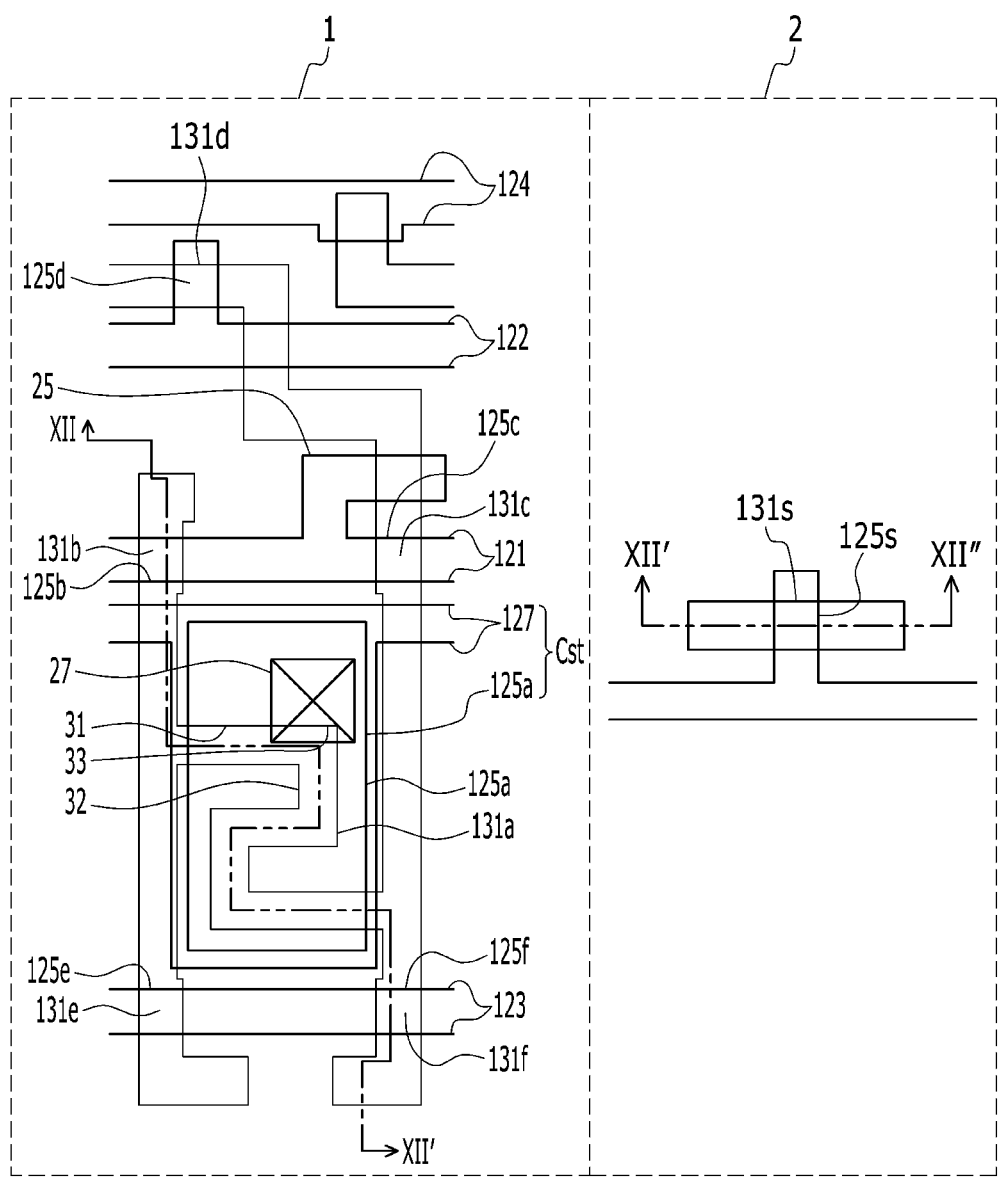
Figure 12:
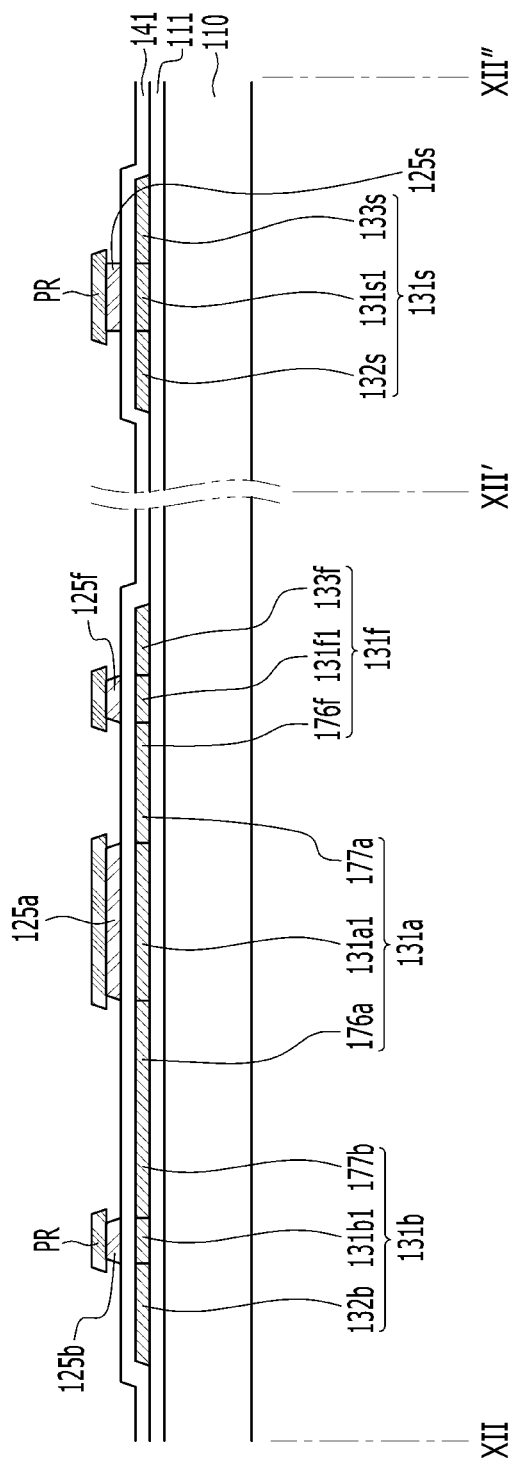
FIG. 12 is a cross-sectional view of the organic light emitting diode display device of FIG. 11, which is taken along lines XII-XII' and XII'-XII", illustrating a step of overetching a peripheral switching gate electrode, a pixel switching gate electrode, and a driving gate electrode by using a photosensitive layer.
Figure 13:
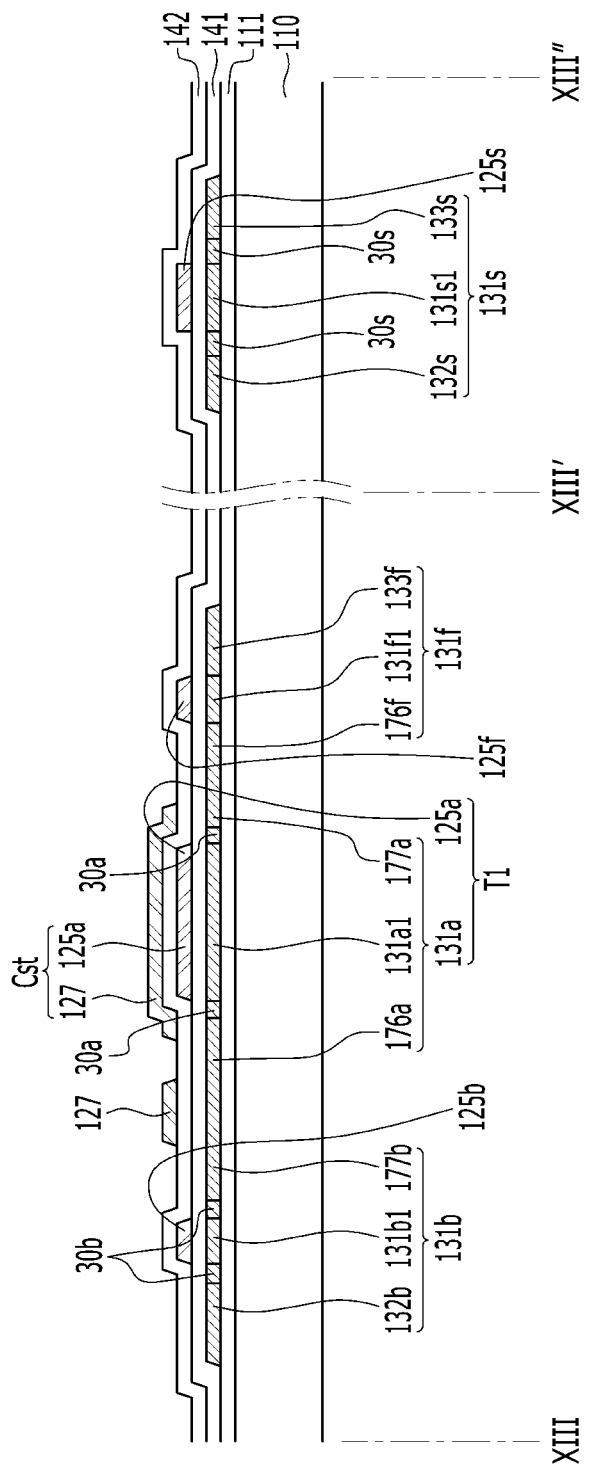
FIG. 13 is a cross-sectional view of the organic light emitting diode display device of FIG. 11, which is taken along lines XII-XII' and XII'-XII", illustrating a step of forming a pixel switching low concentration doping region, a driving low concentration doping region, and a peripheral switching low concentration doping region after the photosensitive layer is removed.
Figure 14:
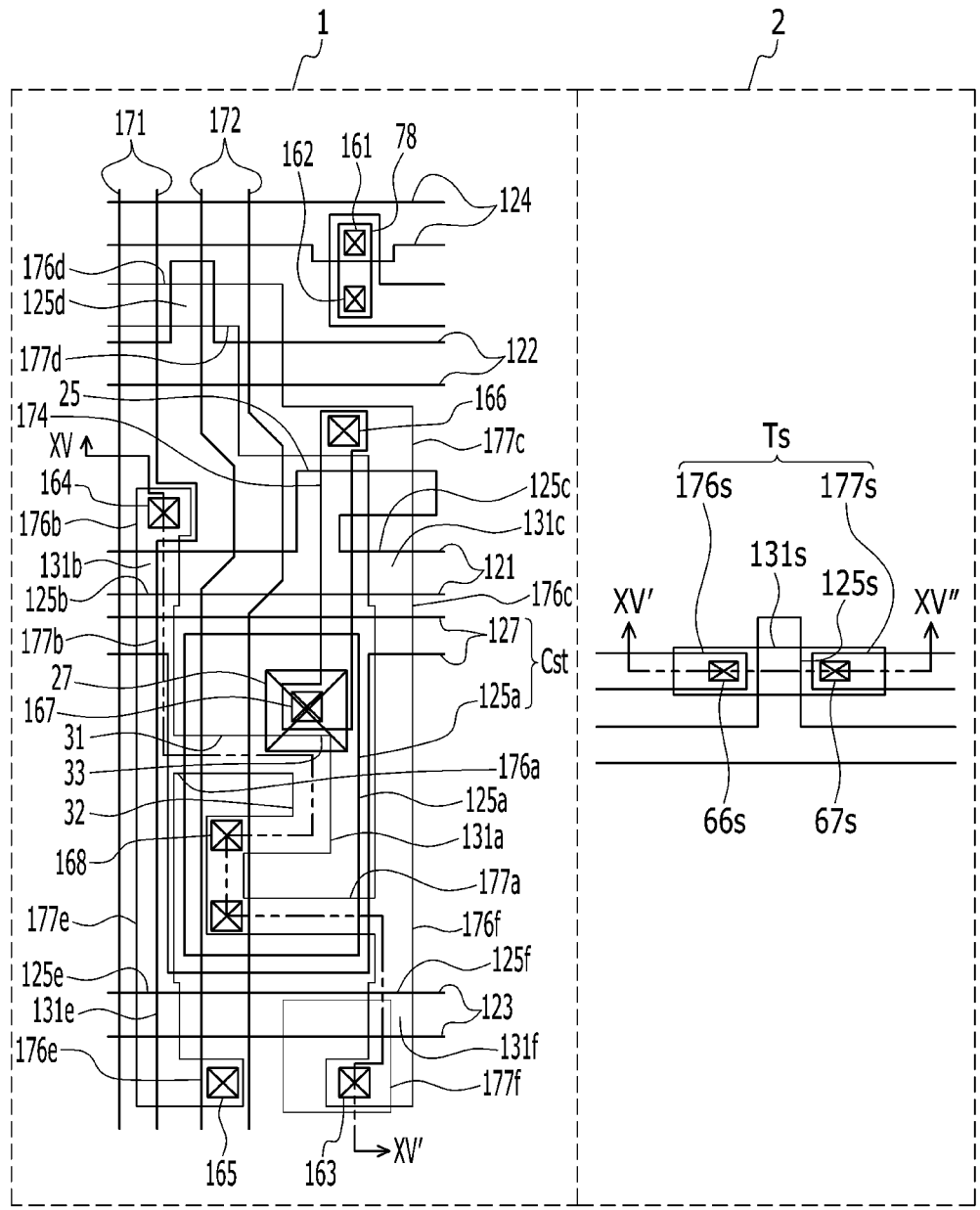
Figure 15:
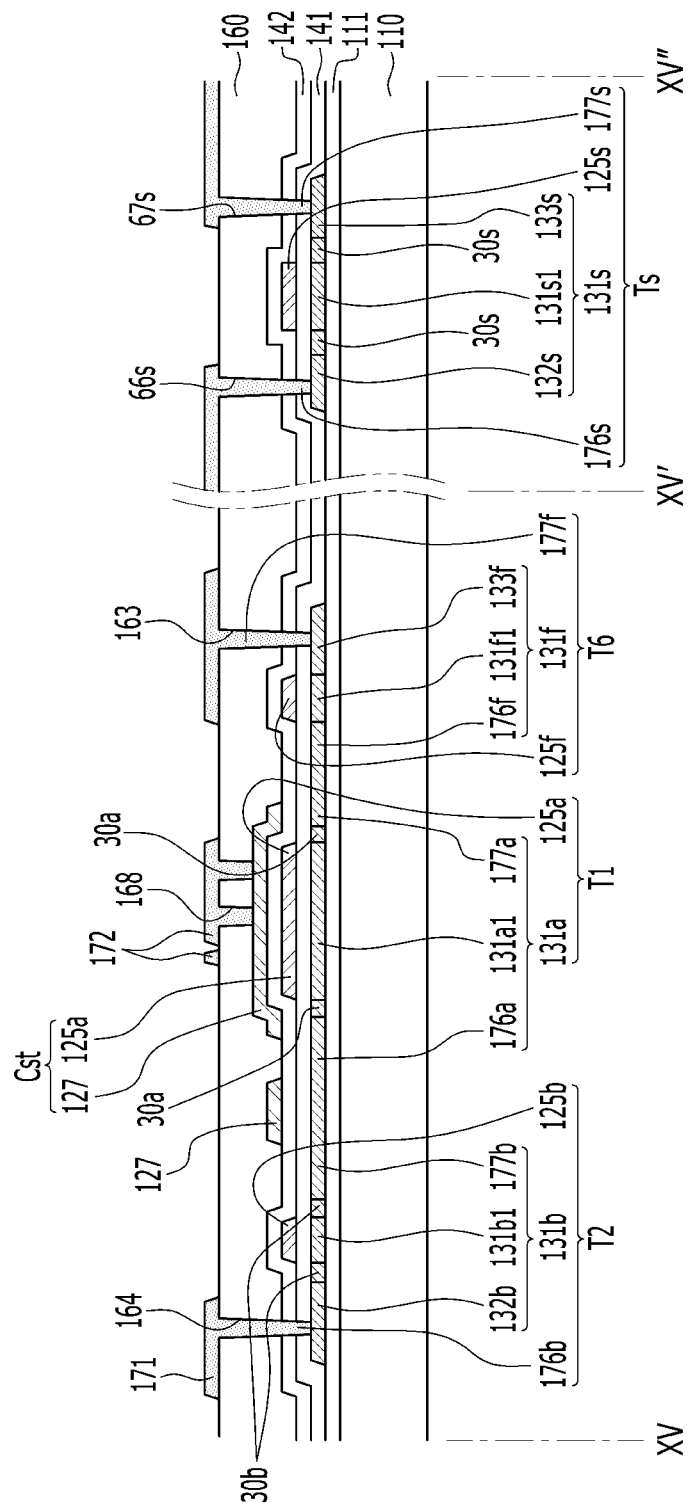
FIG. 15 is a cross-sectional view of the organic light emitting diode display device of FIG. 14, which is taken along lines XIV-XIV' and XIV'-XIV"
Figure 16:
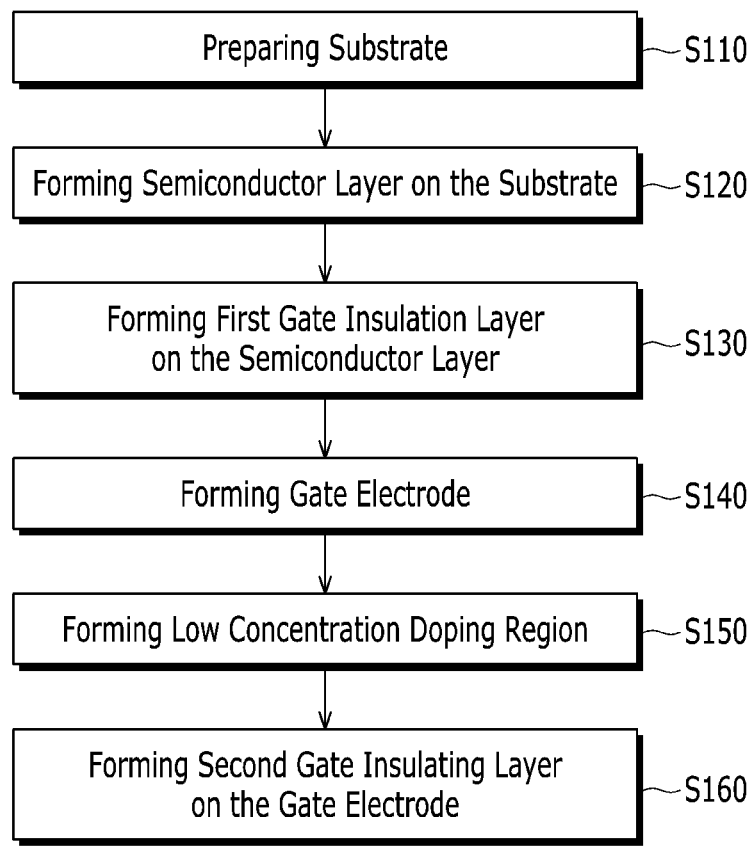
FIG. 16 is a flowchart illustrating manufacturing steps of an organic light emitting diode display device.

FIGS. 9, 11, and 14 are layout views sequentially illustrating the method of manufacturing the organic light emitting diode display device according to the exemplary embodiment. FIG. 10 is a cross-sectional view of the organic light emitting diode display device of FIG. 9, which is taken along lines X-X' and X'-X". FIG. 12 is a cross-sectional view of the organic light emitting diode display device of FIG. 11, which is taken along lines XII-XII' and XII'-XII". FIG. 12 illustrates a step of overetching a peripheral switching gate electrode, a pixel switching gate electrode, and a driving gate electrode by using a photosensitive layer. FIG. 13 is a cross-sectional view of the organic light emitting diode display device of FIG. 11, which is taken along lines XII-XII' and XII'-XII". FIG. 13 illustrates a step of forming a pixel switching low concentration doping region, a driving low concentration doping region, and a peripheral switching low concentration doping region after the photosensitive layer is removed. FIG. 15 is a cross-sectional view of the organic light emitting diode display device of FIG. 14, which is taken along lines XIV-XIV' and XIV'-XIV". FIG. 16 is a flowchart illustrating manufacturing steps of the organic light emitting diode display device.

First, as illustrated in FIGS. 9 and 10, the buffer layer 111 is formed on all of the peripheral portion S and the pixel portion P of the substrate 110 which has been prepared in step S110. The substrate 110 may be formed of a transparent insulating substrate such as glass, quartz, or plastics. The buffer layer 111 may be formed of a single layer of silicon nitride or a laminate layer of silicon nitride and silicon oxide, and is deposited on an entire surface of the substrate 110 by a method such as plasma chemical vapor deposition (PECVD). In addition, a semiconductor layer 131 is formed on the buffer layer 111 of the pixel portion P in step S120. The semiconductor layer 131 may be formed of polysilicon or an oxide semiconductor, and the polysilicon may be formed by a method of forming an amorphous silicon layer and then crystallizing the layer. Various known methods may be applied as the crystallizing method, and for example, the amorphous silicon layer may be crystallized by using heat, a laser, Joule heat, an electric field, a catalyst metal, or the like. In addition, the semiconductor layer 131 is patterned by a photolithography process using a first mask. Thereby, the driving semiconductor layer 131$a$, the pixel switching semiconductor layer 131$b$, the compensation semiconductor layer 131$c$, the initialization semiconductor layer 131$d$, the operation control semiconductor layer 131$e$, the light emission control semiconductor layer 131$f$, and the peripheral switching semiconductor layer 131$s$ are simultaneously formed.

Next, as illustrated in FIGS. 11 and 12, in step S130, a first gate insulating layer 141 is formed on the driving semiconductor layer 131$a$, the pixel switching semiconductor layer 131$b$, the compensation semiconductor layer 131$c$, the initialization semiconductor layer 131$d$, the operation control semiconductor layer 131$e$, and the light emission control semiconductor layer 131$f$ of the pixel portion P, and the peripheral switching semiconductor layer 131$s$ of the peripheral portion S. The first gate insulating layer 141 may be formed of silicon nitride ($SiN_x$), silicon oxide ($SiO_2$), or the like, and is deposited on an entire surface of the buffer layer 111 by a method such as plasma chemical vapor deposition (PECVD).

In addition, the first gate metal layer is formed on the first gate insulating layer 141 in step S140. The first gate metal layer may be formed of a multilayer where a metal layer including any one of copper (Cu), a copper alloy, aluminum (Al), and an aluminum alloy, and a metal layer including any one of molybdenum (Mo) and a molybdenum alloy are laminated. In addition, the photosensitive layer is formed on the first gate metal layer, and the first gate metal layer is patterned by using the second mask by a photolithography process. Thereby, first gate wires 125$a$, 125$b$, 125$c$, 125$d$, 125$e$, 125$f$, 121, 122, 123, and 125$s$ are formed on the pixel portion P and the peripheral portion S.

In addition, the peripheral switching semiconductor layer 131$s$, the driving semiconductor layer 131$a$, the pixel switching semiconductor layer 131$b$, the compensation semiconductor layer 131$c$, the initialization semiconductor layer 131$d$, the operation control semiconductor layer 131$e$, and the light emission control semiconductor layer 131$f$ are classified into a channel region, a source region, and a drain region by doping the peripheral switching semiconductor layer 131$s$, the driving semiconductor layer 131$a$, the pixel switching semiconductor layer 131$b$, the compensation semiconductor layer 131c, the initialization semiconductor layer 131d, the operation control semiconductor layer 131e, and the light emission control semiconductor layer 131f with the impurity by using a photosensitive layer PR formed on the peripheral switching gate electrode 125s, the pixel switching gate electrode 125b, and the driving gate electrode 125a as a mask. The peripheral switching gate electrode 125s, the pixel switching gate electrode 125b, and the driving gate electrode 125a serve to block doping of the channel region with the impurity when the source region and the drain region are doped with the impurity.

In addition, the peripheral switching gate electrode 125s, the pixel switching gate electrode 125b, and the driving gate electrode 125a are overetched by using the photosensitive layer PR formed on the peripheral switching gate electrode 125s, the pixel switching gate electrode 125b, and the driving gate electrode 125a as the mask. Therefore, the widths of the peripheral switching gate electrode 125s, the pixel switching gate electrode 125b, and the driving gate electrode 125a are reduced as compared to the width of the photosensitive layer PR. In addition, after the photosensitive layer PR is removed, the pixel switching semiconductor layer 131b, the driving semiconductor layer 131a, and the peripheral switching semiconductor layer 131s are doped with the impurity at a low concentration by using the overetched peripheral switching gate electrode 125s, pixel switching gate electrode 125b, and driving gate electrode 125a as the mask to form the pixel switching low concentration doping region 30b, the driving low concentration doping region 30a, and the peripheral switching low concentration doping region 30s in step S150.

Next, as illustrated in FIG. 13, the second gate insulating layer 142 is formed on the first gate insulating layer 141 and the first gate wires 125a, 125b, 125c, 125d, 125e, 125f, 121, 122, 123, and 125s in step S160. In addition, the second gate wire including the second storage capacitive plate 127 and the initialization voltage line 124 is formed on the pixel portion P by forming the second gate metal layer on the second gate insulating layer 142 and patterning the second gate metal layer by using a third mask by a photolithography process. In this case, a storage opening 27 is formed in the second storage capacitive plate 127. The second gate metal layer may be formed of a multilayer where a metal layer including any one of copper (Cu), a copper alloy, aluminum (Al), and an aluminum alloy, and a metal layer including any one of molybdenum (Mo) and a molybdenum alloy are laminated.

Next, as illustrated in FIGS. 14 and 15, the interlayer insulating layer 160 is formed on the second gate insulating layer 142, the second storage capacitive plate 127, and the initialization voltage line 124. The interlayer insulating layer 160 is formed of an organic layer or an inorganic layer, and deposited on an entire surface of the substrate 110. In addition, the interlayer insulating layer 160, the first gate insulating layer 141, and the second gate insulating layer 142 are patterned by a photolithography process using a fourth mask to form a plurality of contact holes 161, 162, 163, 164, 165, 166, 167, 168, 66s, and 67s.

In addition, a data metal layer is formed on the interlayer insulating layer 160. The data metal layer may be formed of a multilayer where a metal layer including any one of copper, a copper alloy, aluminum, and an aluminum alloy, and a metal layer including any one of molybdenum and a molybdenum alloy are laminated. For example, the data metal layer may be formed of a Mo/Al/Mo triple layer or a Mo/Cu/Mo triple layer.

In addition, the data metal layer is patterned by a photolithography process using a fifth mask. Thereby, the data wires including the data line 171 including the pixel switching source electrode 176b, the driving voltage line 172, the connection member 174, and the light emission control drain electrode 177f are formed on the interlayer insulating layer 160 of the pixel portion P, and the peripheral switching source electrode 176s and the peripheral switching drain electrode 177s are formed on the interlayer insulating layer 160 of the peripheral portion S.

Next, as illustrated in FIGS. 4 to 8, the protective layer 180 covering the data wires 171, 172, 174, and 177f, the peripheral switching source electrode 176s, and the peripheral switching drain electrode 177s is formed on the interlayer insulating layer 160, and a contact hole 181 is formed in the protective layer 180 by a photolithography process using a sixth mask. In addition, the pixel electrode layer is formed on the protective layer 180 of the pixel portion P, and patterned by a photolithography process using a seventh mask to form the pixel electrode 191 connected through the contact hole 181 to the light emission control drain electrode 177f. In addition, the barrier rib 350 covering the pixel electrode 191 is formed on the protective layer 180, and the barrier rib opening 351 through which a portion of the pixel electrode 191 is exposed is formed in the barrier rib 350 by using an eighth mask. In addition, the organic emission layer 370 is formed on the pixel electrode 191 exposed through the barrier rib opening 351 of the barrier rib 350. In addition, the organic light emitting diode (OLED) is completed by forming the common electrode 270 on the organic emission layer 370. The common electrode 270 is formed even on the barrier rib 350 to be formed over a plurality of pixels.

A sealing member (not illustrated) for protecting the organic light emitting diode (OLED) may be formed on the common electrode 270, may be sealed by a sealant on the substrate 110, and may be formed of various materials such as glass, quartz, ceramic, plastics, and metal. Meanwhile, a sealing thin film layer may be formed by depositing an inorganic layer and an organic layer on the common electrode 270 while not using the sealant.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
   a substrate including a pixel portion displaying an image and a peripheral portion surrounding the pixel portion;
   a semiconductor layer including a pixel switching semiconductor layer and a driving semiconductor layer formed on the pixel portion, and a peripheral switching semiconductor layer formed on the peripheral portion;
   a first gate insulating layer formed on the semiconductor layer;
   a peripheral switching gate electrode formed on the first gate insulating layer of the peripheral portion;
   a pixel switching gate electrode and a driving gate electrode formed on the first gate insulating layer of the pixel portion;
   a second gate insulating layer covering the peripheral switching gate electrode, the pixel switching gate electrode, and the driving gate electrode;
   a peripheral switching low concentration doping region formed in the peripheral switching semiconductor layer;
   a pixel switching low concentration doping region formed in the pixel switching semiconductor layer; and a driving low concentration doping region formed in the driving semiconductor layer, a length of the peripheral switching low concentration doping region formed in the peripheral switching semiconductor layer being larger than a length of the pixel switching low concentration doping region formed in the pixel switching semiconductor layer and a length of the driving low concentration doping region formed in the driving semiconductor layer.

2. The organic light emitting diode display device of claim 1, wherein a doping degree of the peripheral switching low concentration doping region formed in the peripheral switching semiconductor layer is larger than a doping degree of the pixel switching low concentration doping region and the driving low concentration doping region formed in the pixel switching semiconductor layer and the driving semiconductor layer, respectively.

3. The organic light emitting diode display device of claim 1, wherein the length of the pixel switching low concentration doping region formed in the pixel switching semiconductor layer is larger than the length of the driving low concentration doping region formed in the driving semiconductor layer.

4. The organic light emitting diode display device of claim 1, wherein the doping degree of the pixel switching low concentration doping region formed in the pixel switching semiconductor layer is larger than the doping degree of the driving low concentration doping region formed in the driving semiconductor layer.

5. The organic light emitting diode display device of claim 1, further comprising a storage capacitor overlapping the driving semiconductor layer.

6. The organic light emitting diode display device of claim 5, wherein the storage capacitor includes:
a first storage capacitive plate formed on the first gate insulating layer and overlapping the driving semiconductor layer, and
a second storage capacitive plate formed on the second gate insulating layer covering the first storage capacitive plate and overlapping the first storage capacitive plate.

7. The organic light emitting diode display device of claim 6, wherein the driving semiconductor layer includes a plurality of bent portions.

8. The organic light emitting diode display device of claim 7, wherein the driving semiconductor layer includes:
a plurality of first extension portions extending in a first direction; and
a plurality of second extension portions extending in a second direction that is different from the first direction, the bent portions connecting the first extension portions and the second extension portions.

9. The organic light emitting diode display device of claim 6, further comprising:
a scan line formed on the substrate and transferring a scan signal;
a data line and a driving voltage line crossing the scan line and transferring a data signal and a driving voltage, respectively;
a pixel switching transistor connected to the scan line and the data line and including the pixel switching semiconductor layer and the pixel switching gate electrode;
a driving transistor connected to a pixel switching drain electrode of the pixel switching transistor and including the driving semiconductor layer and the driving gate electrode; and
an organic light emitting diode connected to a driving drain electrode of the driving transistor.

10. The organic light emitting diode display device of claim 9, further comprising a peripheral switching transistor including the peripheral switching semiconductor layer and the peripheral switching gate electrode.

11. The organic light emitting diode display device of claim 9, further comprising a compensation transistor connected to the driving transistor and compensating a threshold voltage of the driving transistor.

12. The organic light emitting diode display device of claim 11, further comprising:
a light emission control line transferring a light emission control signal; and
a light emission control transistor connected to the light emission control line and turned-on in response to the light emission control signal transferred by the light emission control line to transfer the driving voltage from the driving transistor to the organic light emitting diode, the light emission control transistor positioned between the driving drain electrode of the driving transistor and the organic light emitting diode.

13. The organic light emitting diode display device of claim 12, further comprising:
an interlayer insulating layer covering the second storage capacitive plate;
a connection member formed on the interlayer insulating layer and connected through a contact hole formed in the second gate insulating layer and the interlayer insulating layer to the first storage capacitive plate; and
a protective layer covering the interlayer insulating layer and the connection member,
the connection member connected to a compensation drain electrode of the compensation transistor.

14. The organic light emitting diode display device of claim 13, wherein the scan line is formed on the same layer as the first storage capacitive plate, and the data line and the driving voltage line are formed on the same layer as the connection member.

15. The organic light emitting diode display device of claim 14, wherein the driving voltage line is connected through a contact hole formed in the interlayer insulating layer to the second storage capacitive plate.

16. The organic light emitting diode display device of claim 15, further comprising an operation control transistor connected to the light emission control line and turned-on in response to the light emission control signal transferred by the light emission control line to transfer the driving voltage to the driving transistor, the operation control transistor positioned between the driving voltage line and a driving source electrode of the driving transistor.

17. The organic light emitting diode display device of claim 16, further comprising:
a prior scan line transferring a prior scan signal; and
an initialization transistor connected to the prior scan line and turned-on in response to the prior scan signal transferred through the prior scan line to transfer an initialization voltage to the driving gate electrode of the driving transistor,
the initialization transistor positioned between the initialization voltage line and the driving gate electrode of the driving transistor.

18. A method of manufacturing an organic light emitting diode display device, comprising:
preparing a substrate including a pixel portion and a peripheral portion;

forming a pixel switching semiconductor layer and a driving semiconductor layer on the pixel portion and a peripheral switching semiconductor layer on the peripheral portion;

forming a first gate insulating layer on the pixel switching semiconductor layer, the driving semiconductor layer, and the peripheral switching semiconductor layer;

forming a peripheral switching gate electrode, a pixel switching gate electrode, and a driving gate electrode on the first gate insulating layer;

forming a pixel switching low concentration doping region in the pixel switching semiconductor layer, a driving low concentration doping region in the driving semiconductor layer, and a peripheral switching low concentration doping region in the peripheral switching semiconductor layer by using a photosensitive layer formed on the pixel switching gate electrode, the driving gate electrode, and peripheral switching gate electrode as a mask; and forming a second gate insulating layer covering the peripheral switching gate electrode, the pixel switching gate electrode, and the driving gate electrode, a length of the peripheral switching low concentration doping region formed in the peripheral switching semiconductor layer being larger than a length of the pixel switching low concentration doping region and the driving low concentration doping region formed in the pixel switching semiconductor layer and the driving semiconductor layer, respectively.

19. The method of manufacturing an organic light emitting diode display device of claim 18, wherein the forming of the pixel switching low concentration doping region, the driving low concentration doping region, and the peripheral switching low concentration doping region includes:

overetching, the pixel switching gate electrode, the driving gate electrode, and the peripheral switching gate electrode by using the photosensitive layer as the mask;

removing the photosensitive layer; and doping a low concentration impurity on each of the pixel switching semiconductor layer, the driving semiconductor layer, and the peripheral switching semiconductor layer by using the overetched pixel switching gate electrode, driving gate electrode, and peripheral switching gate electrode as the mask.

20. The method of manufacturing an organic light emitting diode display device of claim 19, wherein a doping degree of the peripheral switching low concentration doping region formed in the peripheral switching semiconductor layer is larger than a doping degree of the pixel switching low concentration doping region and the driving low concentration doping region formed in the pixel switching semiconductor layer and the driving semiconductor layer, respectively.

21. The method of manufacturing an organic light emitting diode display device of claim 19, wherein the length of the pixel switching low concentration doping region formed in the pixel switching semiconductor layer is larger than the length of the driving low concentration doping region formed in the driving semiconductor layer.

22. The method of manufacturing an organic light emitting diode display device of claim 19, wherein the doping degree of the pixel switching low concentration doping region formed in the pixel switching semiconductor layer is larger than the doping degree of the driving low concentration doping region formed in the driving semiconductor layer.

23. The method of manufacturing an organic light emitting diode display device of claim 19, further comprising forming a storage capacitor overlapping the driving semiconductor layer.

24. The method of manufacturing an organic light emitting diode display device of claim 23, wherein the forming of the storage capacitor includes:

forming a first storage capacitive plate overlapping the driving semiconductor layer on the first gate insulating layer; and forming a second storage capacitive plate overlapping the first storage capacitive plate on the second gate insulating layer covering the first storage capacitive plate.

\* \* \* \* \*